US012641992B2

(12) United States Patent
Yang et al.

(10) Patent No.: US 12,641,992 B2
(45) Date of Patent: May 26, 2026

(54) DISPLAY SUBSTRATES, METHODS FOR MANUFACTURING DISPLAY SUBSTRATES, DISPLAY PANELS AND DISPLAY APPARATUSES

(71) Applicants: Chengdu BOE Optoelectronics Technology Co., Ltd., Sichuan (CN); BOE Technology Group Co., Ltd., Beijing (CN)

(72) Inventors: Guanghui Yang, Beijing (CN); Jiaming Lu, Beijing (CN); Rui Hao, Beijing (CN); Qun Ma, Beijing (CN); Pu Liu, Beijing (CN); Liudong Zhu, Beijing (CN); Qiang Huang, Beijing (CN); Bin He, Beijing (CN); Dinan Duan, Beijing (CN); Haiyong Bai, Beijing (CN); Xin Li, Beijing (CN); Ruiqi Wei, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 896 days.

(21) Appl. No.: 17/914,938

(22) PCT Filed: May 25, 2021

(86) PCT No.: PCT/CN2021/095836
§ 371 (c)(1),
(2) Date: Sep. 27, 2022

(87) PCT Pub. No.: WO2021/238926
PCT Pub. Date: Dec. 2, 2021

(65) Prior Publication Data
US 2023/0110854 A1 Apr. 13, 2023

(30) Foreign Application Priority Data

May 27, 2020 (CN) .......................... 202010463370.4

(51) Int. Cl.
*H10K 59/88* (2023.01)
*H10K 50/844* (2023.01)
(Continued)

(52) U.S. Cl.
CPC ........... *H10K 59/88* (2023.02); *H10K 50/844* (2023.02); *H10K 59/122* (2023.02);
(Continued)

(58) Field of Classification Search
None
See application file for complete search history.

(56) References Cited

U.S. PATENT DOCUMENTS 11,302,879 B2 4/2022 Liu et al.
11,374,200 B2 * 6/2022 Seon .................. H10K 59/8731
(Continued)

FOREIGN PATENT DOCUMENTS

CN 105914224 A 8/2016
CN 107085475 A 8/2017
(Continued)

OTHER PUBLICATIONS

PCT/CN2021/095836 international search report.
(Continued)

*Primary Examiner* — Michelle Mandala
(74) *Attorney, Agent, or Firm* — IPro, PLLC

(57) ABSTRACT

A display substrate includes a substrate and a display region, an isolation region, a peripheral region and a hole disposed on the substrate, wherein the display region surrounds the hole, the isolation region is disposed between the display region and the peripheral region, and the peripheral region
(Continued)

surrounds and adjoins the hole; the isolation region is provided with an isolation column and a first inorganic structure, the isolation column is disposed at a side of the substrate, and the first inorganic structure is disposed at a side of the isolation column away from the substrate; and the peripheral region is provided with a structure layer, and the structure layer is disposed on the substrate and includes a first organic structure and a second inorganic structure disposed along a direction perpendicular to the substrate; wherein the first inorganic structure, the second inorganic structure and the first organic structure all are made of an insulation material, and the first inorganic structure and the second inorganic structure are configured to encapsulate the display substrate.

20 Claims, 9 Drawing Sheets

(51) Int. Cl.

| | |
|---|---|
| *H10K 59/122* | (2023.01) |
| *H10K 59/124* | (2023.01) |
| *H10K 59/80* | (2023.01) |
| *H10K 71/00* | (2023.01) |
| *H10K 59/12* | (2023.01) |
| *H10K 59/65* | (2023.01) |
| *H10K 77/10* | (2023.01) |

(52) U.S. Cl.
    CPC ......... *H10K 59/124* (2023.02); *H10K 59/873* (2023.02); *H10K 71/00* (2023.02); *H10K 59/1201* (2023.02); *H10K 59/65* (2023.02); *H10K 77/111* (2023.02)

(56) References Cited

U.S. PATENT DOCUMENTS

| | | | |
|---|---|---|---|
| 2017/0237037 | A1 | 8/2017 | Choi et al. |
| 2019/0334120 | A1 | 10/2019 | Seo et al. |
| 2020/0006701 | A1* | 1/2020 | Lee ............... H10K 59/8731 |
| 2020/0127233 | A1 | 4/2020 | Sung et al. |
| 2020/0152842 | A1 | 5/2020 | Park et al. |
| 2020/0176538 | A1* | 6/2020 | Um ............... H10K 59/126 |
| 2020/0203660 | A1 | 6/2020 | Shi |
| 2020/0235194 | A1 | 7/2020 | Ito et al. |
| 2020/0243779 | A1 | 7/2020 | Liu et al. |
| 2020/0280021 | A1 | 9/2020 | Li et al. |
| 2020/0295102 | A1* | 9/2020 | Qin ............... H10K 71/00 |
| 2021/0359235 | A1 | 11/2021 | Jiang |
| 2021/0408444 | A1 | 12/2021 | Ouyang et al. |
| 2023/0077957 | A1* | 3/2023 | Okabe ............... G09F 9/30 257/40 |

FOREIGN PATENT DOCUMENTS

| | | | |
|---|---|---|---|
| CN | 107768413 | A | 3/2018 |
| CN | 109616506 | A | 4/2019 |
| CN | 109671864 | A | 4/2019 |
| CN | 110212113 | A | 9/2019 |
| CN | 110265583 | A | 9/2019 |
| CN | 110429199 | A | 11/2019 |
| CN | 110491913 | A | 11/2019 |
| CN | 110518147 | A | 11/2019 |
| CN | 110600511 | A | 12/2019 |
| CN | 110875440 | A | 3/2020 |
| CN | 111133836 | A | 5/2020 |
| CN | 111180485 | A | 5/2020 |
| CN | 111180496 | A | 5/2020 |
| CN | 210535696 | U | 5/2020 |
| WO | 2020087804 | A1 | 5/2020 |

OTHER PUBLICATIONS

PCT/CN2021/095836 Written Opinion.
PCT/CN2020/099169 international search report.
PCT/CN2020/099169 Written Opinion.
U.S. Appl. No. 17/271,490 non-final office action dated Aug. 29, 2023.
CN2020104633704 first office action dated Jun. 5, 2024.
EP20904254.8 extended European search report dated May 23, 2024.

* cited by examiner

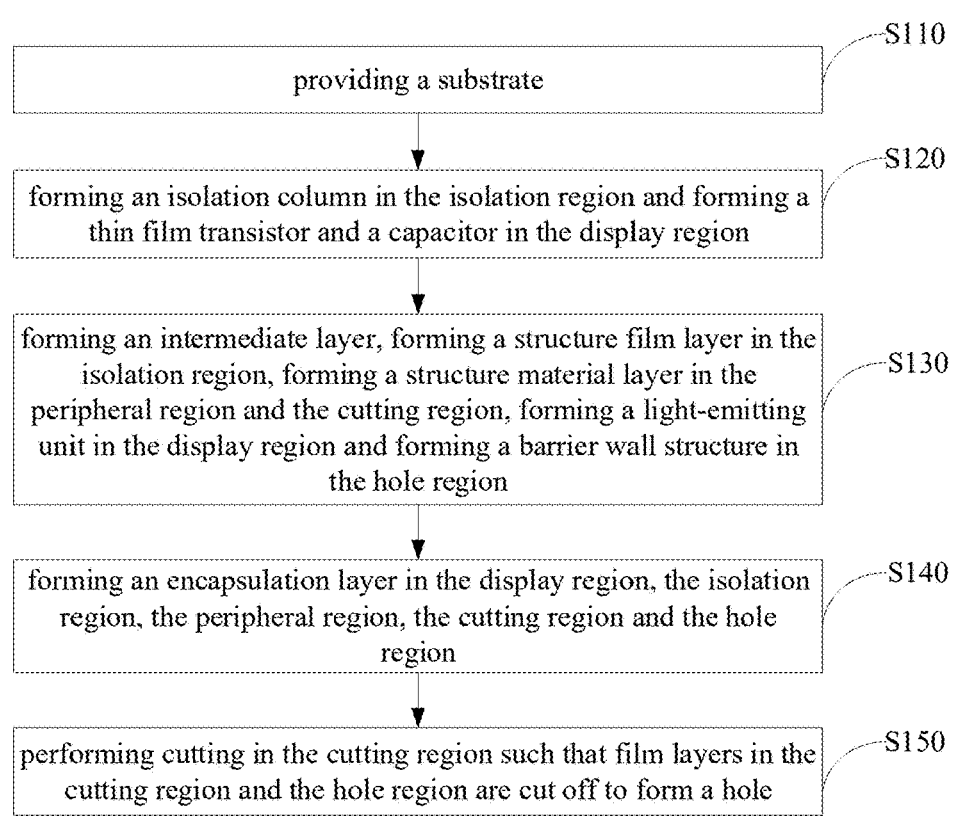

S110 providing a substrate

S120 forming an isolation column in the isolation region and forming a thin film transistor and a capacitor in the display region

S130 forming an intermediate layer, forming a structure film layer in the isolation region, forming a structure material layer in the peripheral region and the cutting region, forming a light-emitting unit in the display region and forming a barrier wall structure in the hole region

S140 forming an encapsulation layer in the display region, the isolation region, the peripheral region, the cutting region and the hole region

S150 performing cutting in the cutting region such that film layers in the cutting region and the hole region are cut off to form a hole

FIG. 10

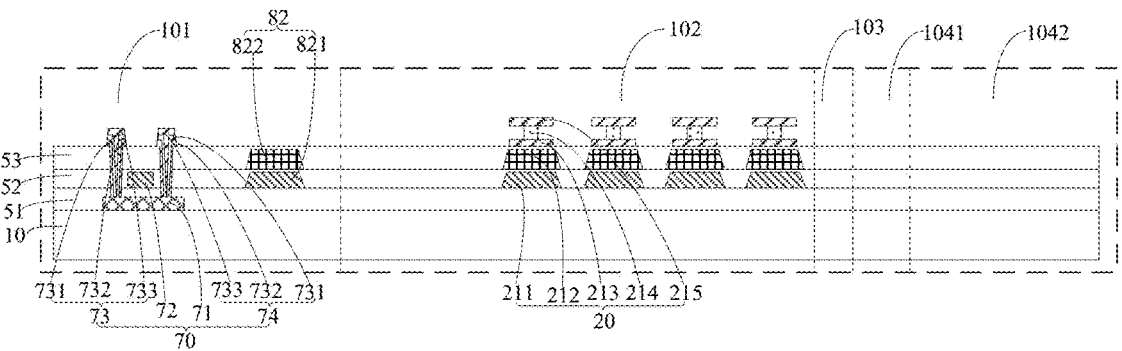

FIG. 11

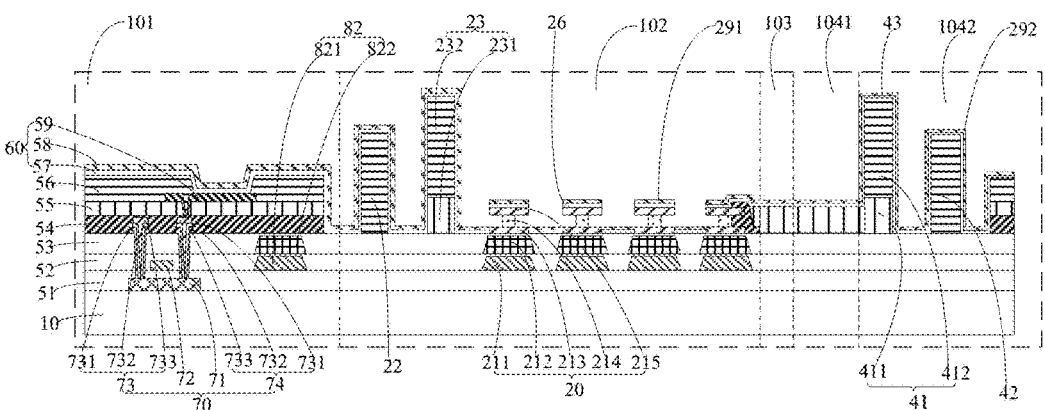

FIG. 12

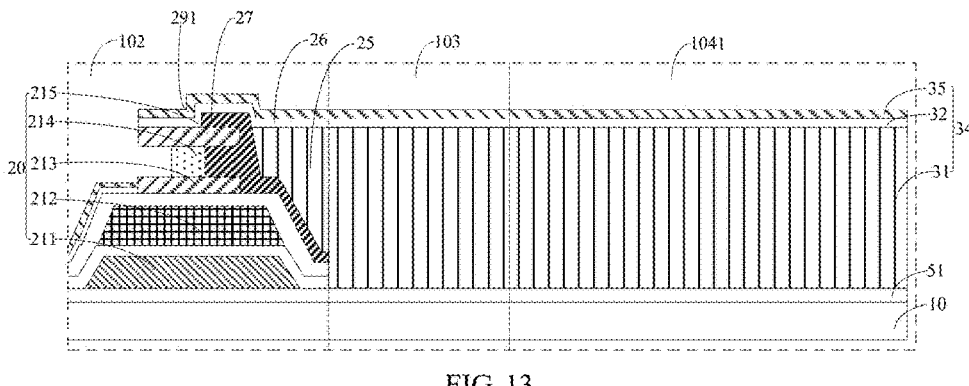
FIG. 13
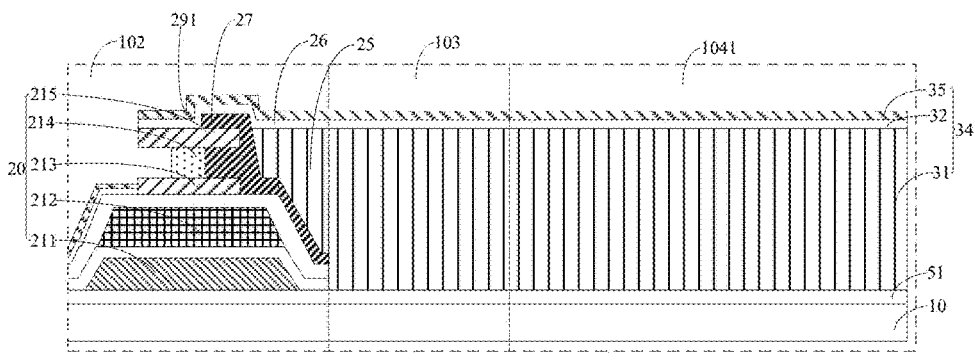
FIG. 14
FIG. 15
FIG. 16

DISPLAY SUBSTRATES, METHODS FOR MANUFACTURING DISPLAY SUBSTRATES, DISPLAY PANELS AND DISPLAY APPARATUSES

This disclosure claims is the U.S. national phase of PCT Application No. PCT/CN2021/095836 filed on May 25, 2021, which priority to Chinese Patent Application No. 202010463370.4 entitled "DISPLAY SUBSTRATES, METHOD FOR MANUFACTURING DISPLAY SUB-STRATES, DISPLAY PANELS AND DISPLAY APPARA-TUSES" filed on May 27, 2020, the entire content of which is incorporated herein by reference.

TECHNICAL FIELD

Embodiments of the present disclosure relate to a display substrate and a method for manufacturing a display sub-strate, a display panel and a display apparatus.

BACKGROUND

Along with rapid development of electronic devices, users have higher and higher requirements for screen-to-body ratios. In order to improve the screen-to-body ratios of display panels of the electronic devices, a hole may be opened on a screen to receive a front camera, a light sensor and the like.

In a process for manufacturing a display panel, when a protective film is attached to the display panel, bubbles may be easily generated in a cutting region of the display panel, and when the display panel is cut to form a hole, air or fine particles generated during cutting process may enter a display region, affecting display effects of the display region and encapsulation effects of the display panel.

SUMMARY

At least one embodiment of the present disclosure pro-vides a display substrate, including:

a substrate and a display region, an isolation region, a peripheral region and a hole disposed on the substrate, wherein the display region surrounds the hole, the isolation region is disposed between the display region and the peripheral region, and the peripheral region surrounds and adjoins the hole;

the isolation region is provided with an isolation column and a first inorganic structure, the isolation column is disposed at a side of the substrate, and the first inor-ganic structure is disposed at a side of the isolation column away from the substrate; and the peripheral region is provided with a structure layer, and the structure layer is disposed on the substrate and includes a first organic structure and a second inorganic structure disposed along a direction perpendicular to the substrate;

wherein each of the first inorganic structure, the second inorganic structure and the first organic structure is made of an insulation material, and the first inorganic structure and the second inorganic structure are con-figured to encapsulate the display substrate.

In an embodiment of the present disclosure, the first inorganic structure includes a first inorganic film and a second inorganic film located at a side of the first inorganic film away from the substrate, the second inorganic structure includes a third inorganic film and a fourth inorganic film located at a side of the third inorganic film away from the substrate; the third inorganic film and the first inorganic film are disposed in a same layer; and the fourth inorganic film and the second inorganic film are disposed in a same layer;

the display substrate further includes an organic material layer, and the organic material layer is disposed at least in the display region and disposed between the first inorganic film and the second inorganic film; in the direction perpen-dicular to the substrate, sizes of the first inorganic film and the second inorganic film are smaller than a size of the organic material layer respectively.

In an embodiment of the present disclosure, a light transmittance of the first organic structure is greater than or equal to 90%; in the direction perpendicular to the substrate, a size of the first organic structure is in a range of 2 μm-4 μm.

In an embodiment of the present disclosure, the substrate and the isolation column are integrally formed.

In an embodiment of the present disclosure, the isolation region is further provided with an organic light-emitting structure and an electrode material, the organic light-emit-ting structure is disposed between the isolation column and the first inorganic structure, the electrode material is dis-posed at a side of the organic light-emitting structure away from the substrate, a difference between a distance from a surface of the peripheral region away from the substrate to the substrate and a maximal distance from a surface of a part of the first inorganic structure at a side, away from the substrate, of the isolation column close to the peripheral region to the substrate is in a range of [−1 μm, 1 μm].

In an embodiment of the present disclosure, the structure layer further includes an organic light-emitting material and an electrode structure located on the substrate;

the first organic structure is disposed on the substrate, the organic light-emitting material is located at a side of the first organic structure away from the substrate, the electrode structure is located at a side of the organic light-emitting material away from the substrate, the second inorganic structure is located at a side of the electrode structure away from the substrate, or, the electrode structure is located at a side of the organic light-emitting material away from the substrate, the first organic structure is located at a side of the elec-trode structure away from the substrate, and the second inorganic structure is located at a side of the first organic structure away from the substrate; or the organic light-emitting material and the electrode struc-ture are disposed on the substrate, the electrode struc-ture is located at a side of the organic light-emitting material away from the substrate, the second inorganic structure is located at a side of the electrode structure away from the substrate, and the first organic structure is disposed at a side of the second inorganic structure away from the substrate.

In an embodiment of the present disclosure, the first organic structure surrounds the hole without disconnection.

In an embodiment of the present disclosure, the first organic structure surrounds the hole with a spacing therebe-tween.

In an embodiment of the present disclosure, the display region further includes a planarization layer and the first organic structure has the same material as that of the planarization layer.

In an embodiment of the present disclosure, the display region further includes a pixel defining layer and the first organic structure has the same material as the pixel defining layer.

In an embodiment of the present disclosure, the isolation region is provided with at least two isolation columns disposed around the peripheral region, and the isolation region is further provided with a passivation protection layer overlapping with the isolation column close to the peripheral region.

In an embodiment of the present disclosure, the passivation protection layer wraps at least part of a top wall and a side wall of the isolation column close to the peripheral region and covers a region between the isolation column close to the peripheral region and the peripheral region.

In an embodiment of the present disclosure, the isolation region is further provided with a second organic structure overlapping with the passivation protection layer.

In an embodiment of the present disclosure, in the direction perpendicular to the substrate, a size of the second organic structure is smaller than a size of the first inorganic structure on at least one position in the isolation region.

In an embodiment of the present disclosure, in a case that the isolation column is disposed on the substrate, in the direction perpendicular to the substrate, a size of the first organic structure is greater than a size of the second organic structure; and in a case that the isolation column and the substrate are integrally formed, in the direction perpendicular to the substrate, the size of the first organic structure is smaller than the size of the second organic structure.

In an embodiment of the present disclosure, the second organic structure and the first organic structure are formed integrally.

In an embodiment of the present disclosure, the isolation region is further provided with an organic light-emitting structure and an electrode material, the organic light-emitting structure is disposed at a side of the isolation column away from the substrate, the electrode material is disposed at a side of the organic light-emitting structure away from the substrate, and the first inorganic structure is disposed at a side of the electrode material away from the substrate;

the organic light-emitting structure is located at a side of the second organic structure away from the substrate, and the first inorganic structure is in contact with the electrode material; or, the second organic structure is located between the electrode material and the first inorganic structure, and the first inorganic structure is in contact with both the electrode material and the second organic structure; and the electrode material and the electrode structure are disposed in a same layer.

In an embodiment of the present disclosure, the hole exposes side walls of each of film layers of the structure layer.

In an embodiment of the present disclosure, the side walls of various film layers of the structure layer are flushed with each other.

In an embodiment of the present disclosure, the isolation region is further provided with a barrier wall and the barrier wall is located at a side of the isolation column close to the display region.

In an embodiment of the present disclosure, the isolation column includes a first film layer formed at a side of the substrate, a second film layer located at a side of the first film layer away from the substrate, a first metal layer located at a side of the second film layer away from the substrate, a second metal layer located at a side of the first metal layer away from the substrate and a third metal layer located at a side of the second metal layer away from the substrate;

an orthographic projection of the second metal layer on the substrate is located within an orthographic projection of the first metal layer on the substrate and within an orthographic projection of the third metal layer on the substrate, so as to form a groove at a side wall of the isolation column; the first film layer surrounds the hole, and the orthographic projection of the first metal layer on the substrate and the orthographic projection of the third metal layer on the substrate both are located within an orthographic projection of the first film layer on the substrate; the second film layer surrounds the hole, and the orthographic projection of the first metal layer on the substrate and the orthographic projection of the third metal layer on the substrate both are located within an orthographic projection of the second film layer on the substrate;

the display region further includes a thin film transistor and a capacitor, the thin film transistor includes a gate electrode, a source electrode and a drain electrode, and the capacitor includes a first pole plate and a second pole plate located at a side of the first pole plate away from the substrate;

the first film layer, the first pole plate and the gate electrode are disposed in a same layer, and the second film layer and the second pole plate are disposed in a same layer; and the drain electrode and the source electrode each include a fourth metal layer, a fifth metal layer located at a side of the fourth metal layer away from the substrate and a sixth metal layer located at a side of the fifth metal layer away from the substrate; the first metal layer and the fourth metal layer are disposed in a same layer, the second metal layer and the fifth metal layer are disposed in a same layer, and the third metal layer and the sixth metal layer are disposed in a same layer.

In an embodiment of the present disclosure, in a direction parallel to the substrate, a ratio of a size of the isolation region to a size of the peripheral region is in a range of 1-5.

In an embodiment of the present disclosure, in the direction perpendicular to the substrate, a ratio of a size of the first organic structure to a size of the second inorganic structure is in a range of 1-3.

In an embodiment of the present disclosure, the display substrate includes an organic planarization structure, the organic planarization structure is located in the display region, the isolation region and the peripheral region and configured for planarizing a touch module and/or a filtering module located at a side of the first organic structure away from the substrate, and the organic planarization structure and the first organic structure are integrally formed.

At least one embodiment of the present disclosure provides a display panel including the above display substrate.

At least one embodiment of the present disclosure provides a display apparatus including the above display panel.

At least one embodiment of the present disclosure provides a display apparatus including a functional module and any one display substrate as mentioned above. The functional module is located at a side of the display substrate away from the substrate and includes at least one of a touch module and a filtering module.

In an embodiment of the present disclosure, the functional module includes a touch module, and the display apparatus further includes a first adhesive layer located at a side of the touch module close to the display substrate; and/or the functional module includes a filtering module, and the display apparatus further includes a second adhesive layer located at a side of the filtering module close to the display substrate.

At least one embodiment of the present disclosure provides a method for manufacturing a display substrate. The display substrate includes: a substrate, a display region, an isolation region, a peripheral region, a cutting region and a hole region disposed on the substrate, wherein the display region surrounds the hole region, the isolation region is disposed between the display region and the peripheral region, and the cutting region adjoins the peripheral region and the hole region;

the method includes:

providing a substrate;

forming an isolation column in the isolation region and forming a thin film transistor and a capacitor in the display region;

forming an intermediate layer, forming a structure film layer in the isolation region, forming a structure material layer in the peripheral region and the cutting region, and forming a light-emitting unit in the display region; wherein the structure material layer at least includes a first organic structure which is insulated;

forming an encapsulation layer in the display region, the isolation region, the peripheral region, the cutting region and the hole region; and performing cutting in the cutting region such that film layers in the cutting region and the hole region are cut off to form a hole.

In an embodiment of the present disclosure, a difference between a distance from a surface of the structure material layer away from the substrate to the substrate and a distance from a surface of the isolation column away from the substrate to the substrate is in a range of [−1 μm, 1 μm].

In an embodiment of the present disclosure, forming the structure film layer in the isolation region includes: forming an organic light-emitting structure in the isolation region; and forming an electrode material at a side of the organic light-emitting structure away from the substrate;

forming the intermediate layer includes: forming a passivation protection material at a side of the thin film transistor away from the substrate; and forming a planarization layer at a side of the passivation protection material away from the substrate;

forming the structure material layer in the peripheral region and the cutting region includes: forming a first organic structure in the peripheral region and the cutting region;

forming an organic light-emitting material at a side of the first organic structure away from the substrate in the peripheral region and the cutting region; forming an electrode structure at a side of the organic light-emitting material away from the substrate in the peripheral region and the cutting region;

forming the light-emitting unit in the display region includes: forming a first electrode layer at a side of the planarization layer away from the substrate in the display region; forming a pixel defining layer at a side of the first electrode layer away from the substrate in the display region wherein a plurality of pixel openings are disposed in the pixel defining layer; forming an organic light-emitting material layer in the display region; forming a second electrode layer at a side of the organic light-emitting material layer away from the substrate in the display region.

In an embodiment of the present disclosure, forming the pixel defining layer at the side of the first electrode layer away from the substrate in the display region and forming the first organic structure in the peripheral region and the cutting region are performed synchronously.

In an embodiment of the present disclosure, forming the planarization layer at the side of the passivation protection material away from the substrate and forming the first organic structure in the peripheral region and the cutting region are performed synchronously.

In an embodiment of the present disclosure, forming the organic light-emitting structure in the isolation region, forming the organic light-emitting material at the side of the first organic structure away from the substrate and forming the organic light-emitting material layer in the display region are performed synchronously.

In an embodiment of the present disclosure, forming the structure film layer in the isolation region includes: forming an organic light-emitting structure in the isolation region; forming an electrode material at a side of the organic light-emitting structure away from the substrate in the isolation region;

forming the intermediate layer includes: forming a passivation protection material at a side of the thin film transistor away from the substrate; and forming a planarization layer at a side of the passivation protection material away from the substrate;

forming the structure material layer in the peripheral region and the cutting region includes: forming an organic light-emitting material in the peripheral region and the cutting region; forming an electrode structure at a side of the organic light-emitting material away from the substrate in the peripheral region and the cutting region; forming a first organic structure at a side of the electrode structure away from the substrate in the peripheral region and the cutting region;

forming the light-emitting unit in the display region includes: forming a first electrode layer at a side of the planarization layer away from the substrate in the display region; forming a pixel defining layer at a side of the first electrode layer away from the substrate in the display region wherein a plurality of pixel openings are disposed in the pixel defining layer; forming an organic light-emitting material layer in the display region; forming a second electrode layer at a side of the organic light-emitting material layer away from the substrate in the display region.

In an embodiment of the present disclosure, forming the first organic structure at the side of the electrode structure away from the substrate in the peripheral region and the cutting region is performed after the second electrode layer is formed at the side of the organic light-emitting material layer away from the substrate in the display region.

In an embodiment of the present disclosure, forming the organic light-emitting structure in the isolation region, forming the organic light-emitting material in the peripheral region and the cutting region and forming the organic light-emitting material layer in the display region are performed synchronously.

In an embodiment of the present disclosure, forming the electrode material at the side of the organic light-emitting structure away from the substrate in the isolation region, forming the electrode structure at the side of the organic light-emitting material away from the substrate in the peripheral region and the cutting region and forming the second electrode layer at the side of the organic light-emitting material layer away from the substrate in the display region are performed synchronously.

In an embodiment of the present disclosure, forming a barrier wall structure in the hole region includes: forming a first barrier wall structure close to the cutting region, and forming a second barrier wall structure away from the cutting region, wherein a distance from a surface of the second barrier wall structure away from the substrate to the substrate is smaller than a distance from a surface of the first barrier wall structure away from the substrate to the substrate;

forming the first barrier wall structure close to the cutting region and forming the second barrier wall structure away from the cutting region include: forming a first partition portion in the hole region; at the same time, forming a second partition portion at a side of the first partition portion away from the substrate and forming the second barrier wall structure at a side of the first partition portion away from the cutting region;

forming the first partition portion in the hole region and forming the planarization layer at the side of the passivation protection material away from the substrate are performed synchronously;

forming the second partition portion at the side of the first partition portion away from the substrate and forming the second barrier wall structure at the side of the first partition portion away from the cutting region at the same time are performed in synchronization with forming the pixel defining layer at the side of the first electrode layer away from the substrate in the display region.

In an embodiment of the present disclosure, forming the isolation column includes forming at least two isolation columns disposed around the peripheral region;

forming the passivation protection material at the side of the thin film transistor away from the substrate includes:

at the side of the thin film transistor away from the substrate, forming a passivation layer in the display region and a passivation protection layer in the isolation region at the same time, wherein the passivation protection layer wraps at least part of a top wall and a side wall of the isolation column close to the peripheral region and covers a region between the isolation column close to the peripheral region and the peripheral region.

In an embodiment of the present disclosure, a second organic structure overlapping with the passivation protection layer is formed in the isolation region.

In an embodiment of the present disclosure, forming the second organic structure and forming the first organic structure are performed synchronously.

In an embodiment of the present disclosure, forming the encapsulation layer in the display region, the isolation region, the peripheral region, the cutting region and the hole region includes:

forming a first inorganic material layer in the display region, the isolation region, the peripheral region, the cutting region and the hole region;

forming an organic material layer at a side of the first inorganic material layer away from the substrate in the display region; and forming a second inorganic material layer at a side of the organic material layer away from the substrate in the display region, the isolation region, the peripheral region, the cutting region and the hole region.

In an embodiment of the present disclosure, forming the isolation column in the isolation region includes:

forming a first film layer surrounding the hole region at a side of the substrate;

forming a second film layer surrounding the hole region at a side of the first film layer away from the substrate;

forming a first metal layer at a side of the second film layer away from the substrate, forming a second metal layer on the first metal layer, and forming a third metal layer on the second metal layer;

wherein an orthographic projection of the second metal layer on the substrate is located within an orthographic projection of the first metal layer on the substrate and within an orthographic projection of the third metal layer on the substrate; the orthographic projection of the first metal layer on the substrate and the orthographic projection of the third metal layer on the substrate are located within an orthographic projection of the first film layer on the substrate and within an orthographic projection of the second film layer on the substrate respectively;

forming the thin film transistor and the capacitor includes:

forming a gate electrode of the thin film transistor and a first pole plate of the capacitor at a side of the substrate;

forming a second pole plate of the capacitor at a side of the first pole plate away from the substrate;

forming a source electrode and a drain electrode of the thin film transistor at a side of the gate electrode away from the substrate;

forming the source electrode and the drain electrode of the thin film transistor at the side of the gate electrode away from the substrate includes:

forming a fourth metal layer at a side of the gate electrode away from the substrate, a fifth metal layer on the fourth metal layer and a sixth metal layer on the fifth metal layer;

wherein forming the first film layer surrounding the hole region at a side of the substrate and forming the gate electrode of the thin film transistor and the first pole plate of the capacitor at a side of the substrate are performed synchronously;

forming the second film layer surrounding the hole region at the side of the first film layer away from the substrate and forming the second pole plate of the capacitor at the side of the first pole plate away from the substrate are performed synchronously;

forming the first metal layer at the side of the second film layer away from the substrate, the second metal layer on the first metal layer and the third metal layer on the second metal layer, are performed in synchronization with forming the fourth metal layer at the side of the gate electrode away from the substrate, the fifth metal layer on the fourth metal layer and the sixth metal layer on the fifth metal layer.

In an embodiment of the present disclosure, in a direction parallel to the substrate, a ratio of a sum of the sizes of the peripheral region and the cutting region to the size of the isolation region is in a range of 1-3.

The embodiments of the present disclosure achieve the following major technical effects:

According to the display substrate and the method for manufacturing the display substrate, the display panel and the display apparatus provided by the embodiments of the present disclosure, the structure layer of the peripheral region includes the second inorganic structure and the first organic structure to increase a thickness of the structure layer so as to make a height difference of the peripheral region and the isolation region smaller. In this case, when a protective film is attached, bubbles will not be easily generated or generated bubbles are small, which can improve the problem that the water and oxygen blocking performance of the display substrate is reduced because bubbles enter the film layers adjacent to the hole to cause the film layers to be stripped during a hole-cutting process, thereby contributing to increase the service life of the display substrate; at the same time, the problem that the display effect of the display region is reduced due to entry of the bubbles into the film layers of the display region can be improved.

BRIEF DESCRIPTION OF THE DRAWINGS

FIG. 10 illustrates a flowchart illustrating a method of manufacturing a display substrate according to an embodiment of the present disclosure;

FIG. 11 illustrates a schematic diagram of a first intermediate structure of a display substrate according to an embodiment of the present disclosure;

FIG. 12 illustrates a schematic diagram of a second intermediate structure of a display substrate according to an exemplary embodiment of the present disclosure;

FIG. 13 illustrates a partially enlarged diagram of the second intermediate structure shown in FIG. 12;

FIG. 14 illustrates a schematic diagram of a second intermediate structure of a display substrate according to another embodiment of the present disclosure;

FIG. 15 illustrates a partially enlarged diagram of the second intermediate structure shown in FIG. 14;

FIG. 16 illustrates a schematic diagram of a second intermediate structure of a display substrate according to yet another embodiment of the present disclosure;

DETAILED DESCRIPTION OF THE EMBODIMENTS

Figure 1:
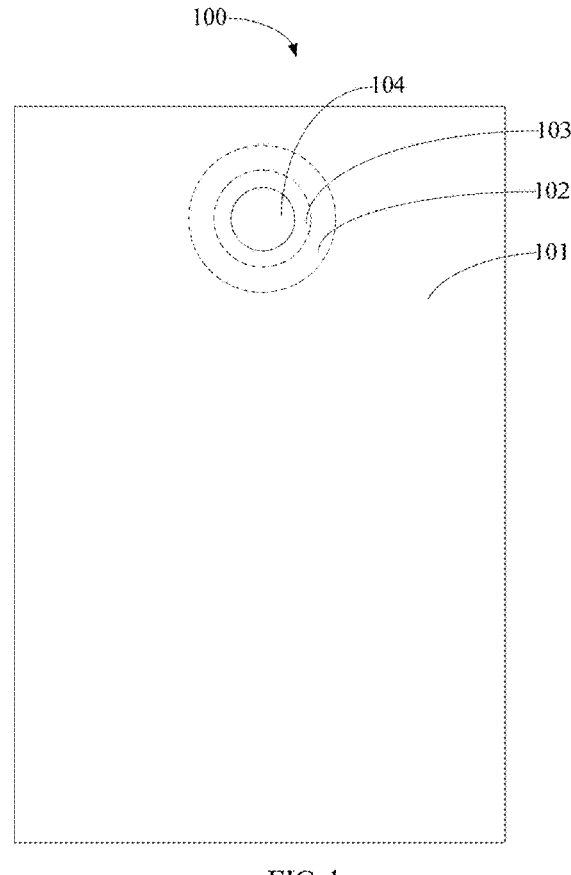
FIG. 1 illustrates a top view of a display substrate according to an embodiment of the present disclosure.

Exemplary embodiments will be described in detail herein, with the illustrations thereof shown in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular embodiments only, and are not intended to limit the present disclosure. Terms "a", "the" and "said" used in their singular forms in the present disclosure and the appended claims are also intended to include plurality, unless clearly indicated otherwise in the context. It should also be understood that the term "and/or" as used herein refers to and includes any or all possible combinations of one or more of the associated listed items.

It is to be understood that, although the terms "first," "second," "third," and the like may be used in the present disclosure to describe various information, such information should not be limited to these terms. These terms are only used to distinguish the same type of information from each other. For example, a first information may also be referred to as a second information and similarly, a second information may also be referred to as a first information, without departing from the scope of the present disclosure. Depending on the context, the word "if" as used herein may be interpreted as "when" or "as" or "in response to determining".

During a manufacturing process of a display panel, after a glass substrate is separated from the panel, it is required to attach a protective film to lower and upper sides of the panel respectively to protect the display panel. Upon attaching the protective film, bubbles are easily generated. In this case, after cutting a hole, the display panel tends to have a decreased display effect or have a decreased water or oxygen blocking performance.

In combination with accompanying drawings, detailed descriptions are made below to a display substrate and a method for manufacturing a display substrate, a display panel and a display apparatus according to embodiments of the present disclosure. In a case of no conflicts, following embodiments and the features of the embodiments can be combined with each other.

Figure 2:
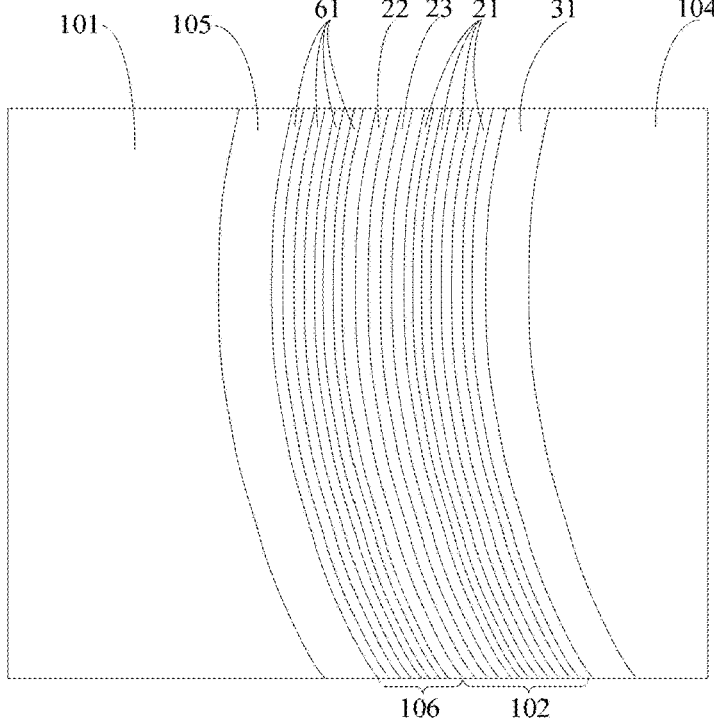
FIG. 2 illustrates a schematic diagram of a partial structure of a display substrate according to an embodiment of the present disclosure.

An embodiment of the present disclosure provides a display substrate. As shown in FIGS. 1 and 2, the display substrate 100 includes a display region 101, an isolation region 102, a peripheral region 103 and a hole 104. The isolation region 102 is disposed between the display region 101 and the peripheral region 103, and the peripheral region 103 surrounds and adjoins the hole 104.

With reference to FIGS. 3-9B, the display substrate 100 includes a substrate 10 with a hole region 111 formed thereon, and an orthographic projection of the hole 104 on the substrate 10 is overlapped with the hole region 111. An isolation column 20 is formed at a side of the substrate 10 and the isolation column 20 is located in the isolation region 102. The isolation region 102 is further provided with a first inorganic structure 24 located at a side of the isolation column 20 away from the substrate 10. The peripheral region 103 is provided with a structure layer 30 which is disposed on the substrate 10. The structure layer 30 includes a first organic structure 31 and a second inorganic structure 33 located at a side of the first organic structure 31 away from the substrate 10, and the first inorganic structure 24 and the second inorganic structure 33 are used for encapsulation.

In the display substrate provided by embodiments of the present disclosure, the structure layer 30 of the peripheral region 103 is formed on the substrate 10 and includes the first organic structure 31 and second inorganic structure 33, so that the structure layer 30 has a relatively large thickness and thus there is a relatively small height difference between the peripheral region 103 and the isolation region 102. In this case, when a protective film is attached, bubbles will not be easily generated or generated bubbles are relatively small, which can alleviate a problem that a water and oxygen blocking performance of the display substrate 100 is reduced because bubbles enter film layers adjacent to the hole 104 to cause the film layers to be stripped during a process of cutting holes, thereby contributing to increase a span life of the display substrate 100; at the same time, the problem that the display effect of the display region is reduced due to entry of the bubbles into the film layers of the display region can be alleviated.

In an embodiment of the present disclosure, as shown in FIG. 2, the display substrate 100 further includes a trace region 105 and an inner isolation region 106, the trace region 105 adjoins the display region 101 and the inner isolation region 106, and the inner isolation region 106 adjoins the isolation region 102. Traces are disposed in the trace region 105. A plurality of inner isolation columns 61 are disposed in the inner isolation region 106 to isolate an organic light-emitting material so as to further improve the water and oxygen blocking performance of the display substrate 100. In embodiments of the present disclosure, a number of the inner isolation columns 61 is not limited.

Figure 9:
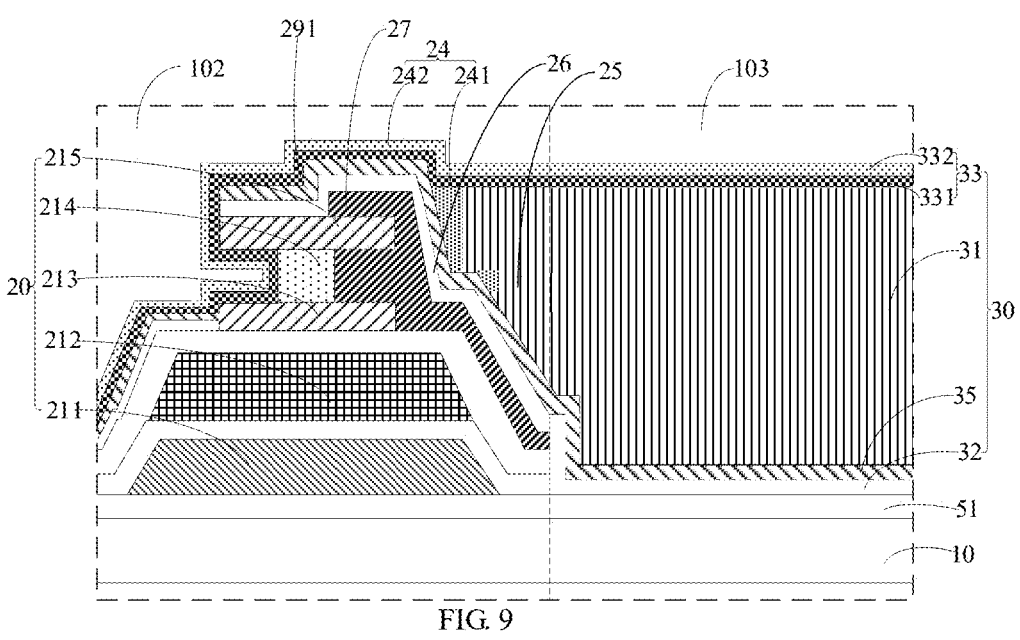
FIG. 9 illustrates a partially enlarged diagram of the display substrate shown in FIG. 8.
Figure 9A:
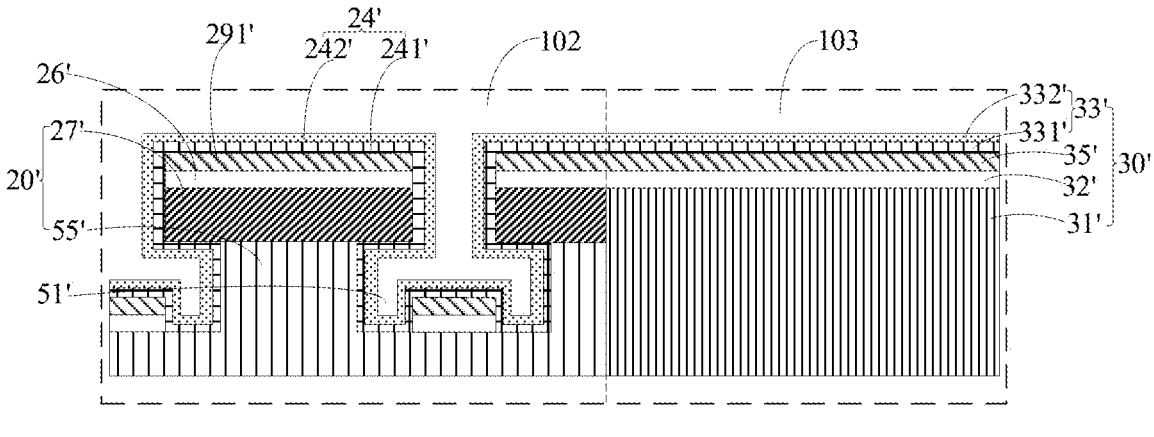
FIG. 9A illustrates a partially enlarged diagram of a display substrate according to still another embodiment of the present disclosure.
Figure 9B:
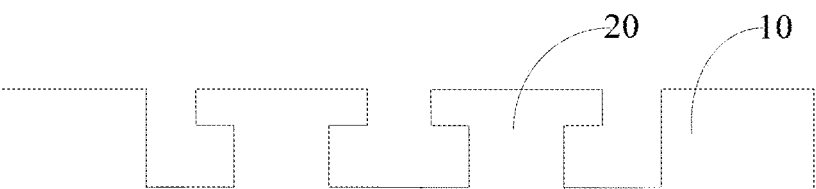
FIG. 9B illustrates a schematic diagram of a partial structure of a substrate of a display substrate according to still another embodiment of the present disclosure.

In an embodiment of the present disclosure, forming an isolation column at a side of the substrate 10 refers to that the isolation column is located on the substrate 10 or the isolation column and the substrate 10 are integrally formed. In the embodiments of FIGS. 3-9A, the isolation column is located on the substrate 10. In the embodiment of FIG. 9B, the isolation column 20 and the substrate 10 are integrally formed, that is, the isolation column 20 is formed by opening a groove in the substrate 10.

In an embodiment of the present disclosure, in a direction parallel to the substrate 10, a ratio of a size of the isolation region 102 to a size of the peripheral region 103 is in a range of 1-5. In the direction parallel to the substrate 10, the ratio of the size of the isolation region 102 to the size of the peripheral region 103 may be, for example, 1, 2, 3, 4, or 5 or the like.

In an embodiment of the present disclosure, in the direction perpendicular to the substrate 10, a ratio of a size of the first organic structure 31 to a size of the second inorganic structure 33 is in a range of 1-3. In the direction perpendicular to the substrate 10, the ratio of the size of the first organic structure 31 to the size of the second inorganic structure 33 may be, for example, 1, 2, or 3 or the like.

In an embodiment of the present disclosure, in a direction parallel to the substrate 10, the size of the peripheral region 103 is in a range of 10 μm-100 μm. In a direction parallel to the substrate 10, the size of the peripheral region 103 may be, for example, 10 μm, 30 μm, 50 μm, 70 μm, 100 μm or the like.

In an embodiment of the present disclosure, a light transmittance of the first organic structure 31 of the structure layer 30 is greater than or equal to 90%. The light transmittance of the first organic structure 31 of the structure layer 30 may be, for example, 90%, 92%, 95%, 97% or 99% or the like.

Figure 4:
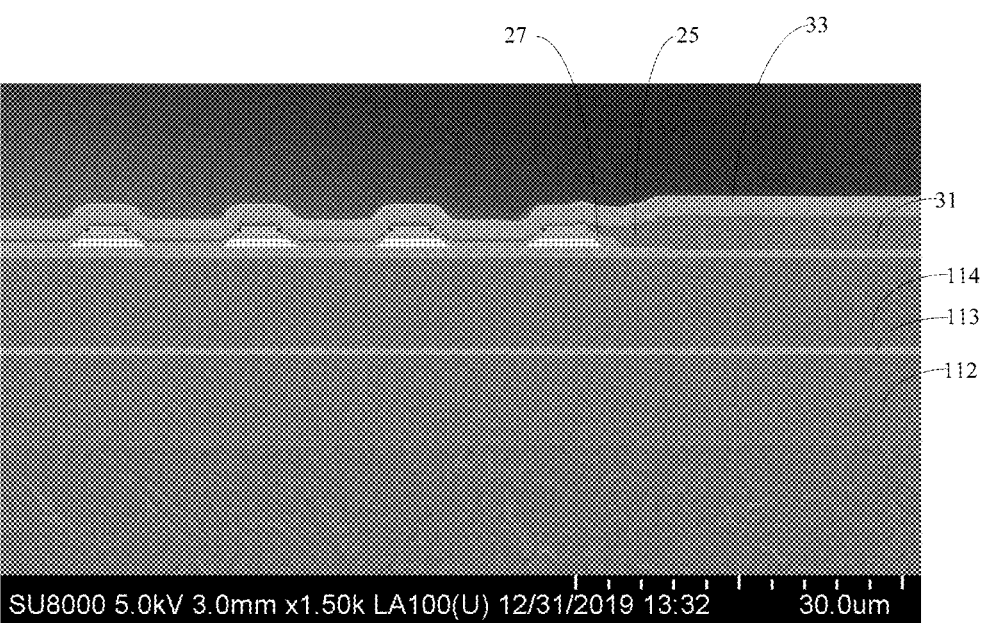
FIG. 4 illustrates a scan electron microscopy graph of a partial structure of the display substrate shown in FIG. 3.

In an embodiment of the present disclosure, the substrate 10 includes a flexible matrix layer, a barrier layer and a buffer layer. A material of the flexible matrix layer may include one or more of polyimide (PI), polyethylene terephthalate (PET) and polycarbonate (PC). In some embodiments of the present disclosure, as shown in FIG. 4, the substrate 10 may include a flexible matrix layer 112, a first barrier layer 113 located on the flexible matrix layer 112, a flexible matrix layer 114 located at a side of the first barrier layer 113 away from the flexible matrix layer 112, a second barrier layer located at a side of the flexible matrix layer 114 away from the first barrier layer 113 and a buffer layer located at a side of the second barrier layer away from the flexible matrix layer 114. Alternatively, the substrate 10 may also include only the flexible matrix layer. In the embodiment of FIG. 4, in the direction perpendicular to the substrate 10, a size of the second barrier layer is in a range of 5000 Å-6000 Å, and a size of the buffer layer is in a range of 3500 Å-4500 Å. In some embodiments of the present disclosure, in the direction perpendicular to the substrate 10, the size of the second barrier layer is 5500 Å and the size of the buffer layer is 4000 Å.

Figure 3:
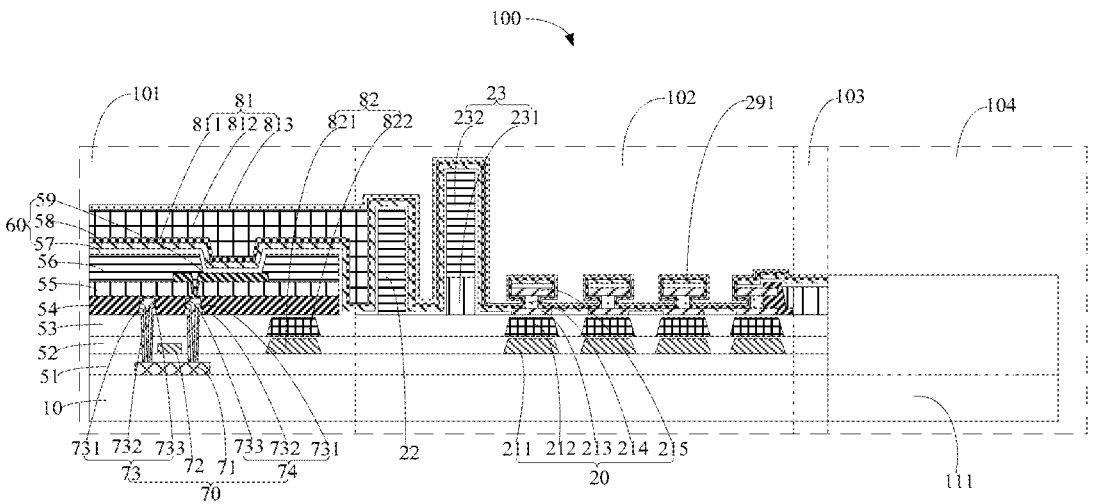
FIG. 3 illustrates a partial sectional view of a display substrate according to an embodiment of the present disclosure.

In an embodiment of the present disclosure, as shown in FIG. 3, the display substrate 100 includes a pixel circuit layer located in the display region 101 and a light-emitting unit 60 located at a side of the pixel circuit layer away from the substrate 10.

The pixel circuit layer includes a thin film transistor 70 and a capacitor 82. The thin film transistor 70 includes an active layer 71, a gate electrode 72, a source electrode 73 and a drain electrode 74. Each of the source electrode 73 and the drain electrode 74 includes a fourth metal layer 731, a fifth metal layer 732 located at a side of the fourth metal layer 731 away from the substrate 10 and a sixth metal layer 733 located at a side of the fifth metal layer 732 away from the substrate 10. The capacitor 82 includes a first pole plate 821 and a second pole plate 822 located at a side of the first pole plate 821 away from the substrate 10. The first pole plate 821 and the gate electrode 72 may be disposed in a same layer.

The light-emitting unit 60 includes a first electrode layer 59 located at a side of the pixel circuit layer away from the substrate 10, an organic light-emitting material layer 57 located at a side of the first electrode layer 59 away from the substrate 10, and a second electrode layer 58 located at a side of the organic light-emitting material layer 57 away from the substrate 10. The first electrode layer 59 may be an anode and the second electrode layer 58 may be a cathode.

The display substrate 100 may further include a gate insulation layer 51, a capacitor insulation layer 52, an inter-layer dielectric layer 53, a passivation layer 54, a planarization layer 55, a pixel defining layer 56 and an encapsulation layer 81, which are disposed on the substrate 10.

The gate insulation layer 51 is located between the active layer 71 and the gate electrode 72, the capacitor insulation layer 52 is located between the gate electrode 72 and the second pole plate 822, and the inter-layer dielectric layer 53 is located at a side of the second pole plate 822 away from the substrate 10. Through holes penetrating through the gate insulation layer 51, the capacitor insulation layer 52 and the inter-layer dielectric layer 53 are disposed on the gate insulation layer 51, the capacitor insulation layer 52 and the inter-layer dielectric layer 53, and the source electrode 73 and the drain electrode 74 are electrically connected with the active layer 71 through the through holes respectively.

The gate insulation layer 51, the capacitor insulation layer 52 and the inter-layer dielectric layer 53 are at least partially located in the display region 101 and the isolation region 102. The gate insulation layer 51 may also be partially located in the peripheral region 103; or the gate insulation layer 51 and the capacitor insulation layer 52 may be partially located in the peripheral region 103; or the gate insulation layer 51, the capacitor insulation layer 52 and the inter-layer dielectric layer 53 may be partially located in the peripheral region 103. In a case that the gate insulation layer 51 is partially located in the peripheral region 103 while the capacitor insulation layer 52 and the inter-layer dielectric layer 53 are both not disposed in the peripheral region 103, or the gate insulation layer 51, the capacitor insulation layer 52 and the inter-layer dielectric layer 53 are all not disposed in the peripheral region 103, there are relatively fewer inorganic layers in the peripheral region 103, which contributes to reduce cracks generated during cutting holes, decrease a possibility that the cracks propagate to the display region 101 and improve the yield of the display substrate 100.

The passivation layer 54 is located in the display region 101 and disposed at a side of the inter-layer dielectric layer 53 away from the substrate 10. The planarization layer 55 is located in the display region 101 and disposed at a side of the passivation layer 54 away from the substrate 10. A contact hole penetrating through the planarization layer 55 and the passivation layer 54 is disposed in the planarization layer 55 and the passivation layer 54, the first electrode layer 59 is disposed at a side of the planarization layer 55 away from the substrate 10, and the first electrode layer 59 is electrically connected with the drain electrode 74 through the contact hole.

The pixel defining layer 56 is located in the display region 101 and disposed at a side of the first electrode layer 59 away from the substrate 10. A pixel opening is disposed on the pixel defining layer 56 to expose a part of the first electrode layer 59, and at least one part of the organic light-emitting material layer 57 is disposed in the pixel opening.

The encapsulation layer 81 includes a first inorganic material layer 811, an organic material layer 812 disposed at a side of the first inorganic material layer 811 away from the substrate 10 and a second inorganic material layer 813 disposed at a side of the organic material layer 812 away from the substrate 10. The first inorganic material layer 811 is disposed at a side of the second electrode layer 58 away from the substrate 10. The first inorganic material layer 811 is disposed in the display region 101, the isolation region 102 and the peripheral region 103, at least a part of the organic material layer 812 is disposed in the display region 101, and at least a part of the second inorganic material layer 813 is disposed in the display region 101, the isolation region 102 and the peripheral region 103. In the direction perpendicular to the substrate, a size of the first inorganic material layer 811 and a size of the second inorganic material layer 813 are smaller than that of the organic material layer 812 respectively.

In an embodiment of the present disclosure, in the direction perpendicular to the substrate 10, each of the size of the first inorganic material layer 811 and the size of the second inorganic material layer 813 are in a range of 0.5 μm-2 μm. In some embodiments of the present disclosure, in the direction perpendicular to the substrate 10, the size of the first inorganic material layer 811 is 1.0 μm and the size of the second inorganic material layer 813 is 0.7 μm.

In an embodiment of the present disclosure, at least two isolation columns 20 surrounding the peripheral region 103 are disposed in the isolation region 102. As shown in FIGS. 4-9, the isolation region 102 is further provided with a passivation protection layer 27 and the passivation protection layer 27 overlaps with a side close to the peripheral region 103 of the isolation column 20 which is closest to the peripheral region 103. The passivation protection layer 27 can increase the ability of the isolation region 102 to block water and oxygen and prevent failure of encapsulation. In the embodiment of FIG. 4, four isolation columns 20 surrounding the peripheral region 103 are disposed in the isolation region 102. In other embodiments of the present disclosure, a number of the isolation columns 20 disposed in the isolation region 102 may be different from four, for example, may be 5 or 7 or the like.

In an embodiment of the present disclosure, in a direction parallel to the substrate 10, a distance between two adjacent isolation columns 20 is in a range of 8 μm-10 μm. In an exemplary embodiment, the distance between two adjacent isolation columns 20 may be 9.2 μm.

In an embodiment of the present disclosure, in the direction perpendicular to the substrate 10, the size of the passivation protection layer 27 is in a range of 2000 Å-3000 Å. In an exemplary embodiment of the present disclosure, in the direction perpendicular to the substrate 10, the size of the passivation protection layer 27 is 2500 Å.

In an embodiment of the present disclosure, the passivation protection layer 27 has a material as same as that of the passivation layer 54 located in the display region 101. The material of the passivation protection layer 27 and the passivation layer 54 is an inorganic material, for example, silicon oxide and silicon nitride or the like.

In an embodiment of the present disclosure, the passivation protection layer 27 and the passivation layer 54 are formed in one patterning process. As such, it contributes to simplify a preparing process.

In an embodiment of the present disclosure, the passivation protection layer 27 surrounds at least parts of a top wall and a side wall of the isolation column 20 close to the peripheral region 103 and covers a region between the isolation column 20 close to the peripheral region 103 and the peripheral region 103.

In an embodiment of the present disclosure, the isolation region 102 is further provided with a second organic structure 25 which is overlapped with the passivation protection layer 27. The disposal of the second organic structure 25 contributes to increase a height of the region between the isolation column 20 close to the peripheral region 103 and the peripheral region 103, and reduce a height difference of the peripheral region 103 and the isolation column 20, thereby contributing to avoid bubbles from being generated in the region at the time of attaching protective films.

In an embodiment of the present disclosure, the isolation region 102 is further provided with an organic light-emitting structure 26 located at a side of the isolation column 20 away from the substrate 10 and an electrode material 291 located at a side of the organic light-emitting structure 26 away from the substrate 10. The first inorganic structure 24 is disposed at a side of the electrode material 291 away from the substrate 10. When the organic light-emitting structure 26 is disposed at a side of the second organic structure 25 away from the substrate 10, the first inorganic structure 24 is in contact with the electrode material 291. In a case where the second organic structure 25 is located between the electrode material 291 and the first inorganic structure 24, all the electrode material 291 is in contact with the first inorganic structure 24. The first inorganic structure 24 can prevent invasion of water and oxygen in air.

The organic light-emitting structure 26 and the organic light-emitting material layer 57 of the display region 101 are formed in a same process. The organic light-emitting structure 26 and the organic light-emitting material layer 57 include at least one of an electron injection layer, an electron transport layer, a hole injection layer and a hole transport layer. The first inorganic structure 24 includes a first inorganic film 241 and a second inorganic film 242 located at a side of the first inorganic film 241 away from the substrate 10. The first inorganic film 241 is a part of the first inorganic material layer 811 located in the isolation region 102, and the second inorganic film 242 is a part of the second inorganic material layer 813 located in the isolation region 102.

In an embodiment of the present disclosure, in the direction perpendicular to the substrate 10, on at least one position of the isolation region 102, the size of the second organic structure 25 is smaller than that of the first inorganic structure 24.

In an embodiment of the present disclosure, the isolation region 102 is further provided with a barrier wall which is located at a side of the isolation column 20 close to the display region 101. The barrier wall of the isolation region 102 may include a first barrier wall 22 and a second barrier wall 23 at a side of the first barrier wall away from the display region 101. The first barrier wall 22 and the second barrier wall 23 are located at a side of the inter-layer dielectric layer 53 away from the substrate 10. A distance from a surface of the side of the first barrier wall 22 away from the substrate 10 to the substrate 10 is smaller than a distance from a surface of the side of the second barrier wall away from the substrate 10 to the substrate 10. The second barrier wall 23 includes a third partition portion 231 at a side of the inter-layer dielectric layer 53 away from the substrate 10 and a fourth partition portion 232 at a side of the third partition portion 231 away from the substrate 10.

In an embodiment of the present disclosure, the third partition portion 231 has the same material as that of the planarization layer 55. Furthermore, the third partition portion 231 and the planarization layer 55 are formed in one patterning process so as to simplify the preparation process.

In an embodiment of the present disclosure, the fourth partition portion 232, the first barrier wall 22 and the pixel defining layer 56 have the same material. Furthermore, the fourth partition portion 232, the first barrier wall 22 and the pixel defining layer 56 are formed in one patterning process so as to simplify the preparation process.

In an embodiment of the present disclosure, each of the organic light-emitting structure 26 and the electrode material 291 is discontinued at side walls of the isolation column 20, that is, the organic light-emitting structure 26 and the electrode material 291 are not continuous at the side walls of the isolation column 20. The discontinuity of the organic light-emitting structure 26 at the side wall of the isolation column 20 can interrupt a passage through which water and oxygen in the air enters the display region 101 along the organic light-emitting material, thus preventing water and oxygen in the air from entering the display region 101 through the organic light-emitting structure 26.

In an embodiment of the present disclosure, the organic light-emitting structure 26 and the electrode material 291 are not discontinued at side walls of the first barrier wall 22 and the second barrier wall 23, that is, the organic light-emitting structure 26 and the electrode material 291 are continuous at the side walls of the first barrier wall 22 and the second barrier wall 23. In the embodiment shown in the drawings, the organic light-emitting structure 26 includes the organic light-emitting material located at a side of the first barrier wall 22 away from the substrate 10 and the organic light-emitting material located at a side of the second barrier wall 23 away from the substrate 10, the organic light-emitting material located at the side walls of the first barrier wall 22 and the second barrier wall 23, the organic light-emitting material located in a region between the first barrier wall 22 and the second barrier wall 23, the organic light-emitting material located between the second barrier wall 23 and the isolation column 20 close to the second barrier wall 23, and the organic light-emitting material located between two adjacent isolation columns. That is, the organic light-emitting structure 26 is continuous at the side walls of the first barrier wall 22 and the second barrier wall 23. The electrode material 291 is continuous at the side walls of the first barrier wall 22 and the second barrier wall 23. In other embodiments, the organic light-emitting structure 26 and the electrode material 291 may be discontinued at the side walls of the first barrier wall 22 and the second barrier wall 23. Generally, when a slope of the first barrier wall 22 and the second barrier wall 23 is small, the organic light-emitting structure 26 and the electrode material 291 may not be discontinued at the side walls of the first barrier wall 22 and the second barrier wall 23; when the slope of the first barrier wall 22 and the second barrier wall 23 is large, the organic light-emitting structure 26 and the electrode material 291 may be discontinued at the side walls of the first barrier wall 22 and the second barrier wall 23.

In an embodiment of the present disclosure, the isolation column 20 includes a first film layer 211 disposed on the substrate 10, a second film layer 212 disposed at a side of the first film layer 211 away from the substrate 10, a first metal layer 213 disposed at a side of the second film layer 212 away from the substrate 10, a second metal layer 214 disposed at a side of the first metal layer 213 away from the substrate 10 and a third metal layer 215 disposed at a side of the second metal layer 214 away from the substrate 10.

An external boundary of an orthographic projection of the second metal layer 214 on the substrate 10 is located within an external boundary of an orthographic projection of the first metal layer 213 on the substrate 10 and within an external boundary of an orthographic projection of the third metal layer 215 on the substrate 10, so as to form a groove at the side wall of the isolation column 20. The first film layer 211 surrounds the hole 104, and the orthographic projections of the first metal layer 213 and the third metal layer 215 on the substrate 10 are located within an orthographic projection of the first film layer 211 on the substrate 10. The second film layer 212 surrounds the hole 104, and the orthographic projections of the first metal layer 213 and the third metal layer 215 on the substrate 10 are located within an orthographic projection of the second film layer 212 on the substrate 10. The organic light-emitting material in the isolation region 102 discontinues at the groove of the isolation column 20, such that the organic light-emitting structure 26 is discontinued at the side walls of the isolation column 20. In this way, a passage through which water and oxygen in air enters the display region 101 along the organic light-emitting material is interrupted, thus preventing water and oxygen in air from entering the display region 101 through the organic light-emitting structure 26, which contributes to extend the service life of the display substrate 100. The first film layer 211 and the second film layer 212 are used to increase a height of the isolation column 20 and reduce cracks generated in the substrate 10 during the hole-cutting process.

Furthermore, the first film layer 211, the first pole plate 821 and the gate electrode 72 are disposed in a same layer, and the second film layer 212 and the second pole plate 822 are disposed in a same layer. In this case, the first film layer 211, the first pole plate 821 and the gate electrode 72 can be formed in a same patterning process, and the second film layer 212 and the second pole plate 822 can be formed in a same patterning process, thus contributing to simplify the preparation process.

Each of the drain electrode 74 and the source electrode 73 includes a fourth metal layer 731, a fifth metal layer 732 located at a side of the fourth metal layer 731 away from the substrate 10 and a sixth metal layer 733 located at a side of the fifth metal layer 732 away from the substrate 10; the first meta layer 213 and the fourth metal layer 731 are disposed in a same layer, the second metal layer 214 and the fifth metal layer 732 are disposed in a same layer, and the third metal layer 215 and the sixth metal layer 733 are disposed in a same layer. The first metal layer 213 and the third metal layer 215 may be made of titanium and the second metal layer 214 may be made of aluminum.

In an embodiment of the present disclosure, in a direction parallel to the substrate 10, a size of the isolation column 20 is in a range of 3 µm-9 µm. In an exemplary embodiment, in a direction parallel to the substrate 10, a size of the third metal layer 215 of the isolation column 20 is 4.8 µm.

Figure 9C:
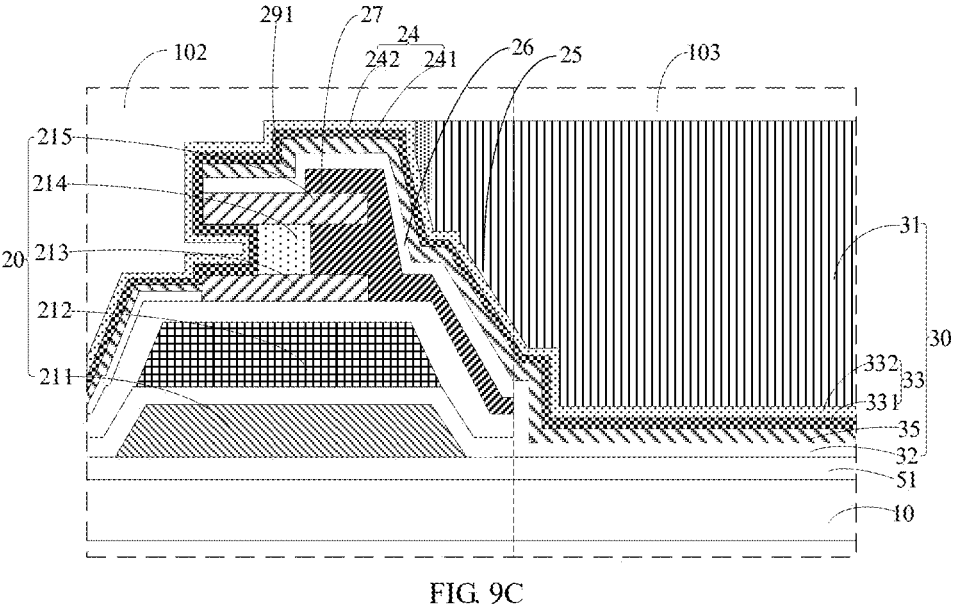
FIG. 9C illustrates a partially enlarged diagram of a display substrate according to still another embodiment of the present disclosure.

In an embodiment of the present disclosure, in the direction perpendicular to the substrate 10, a sum of the sizes of the first metal layer 213, the second metal layer 214 and the third metal layer 215 is in a range of 5000 Å-7000 Å. In an exemplary embodiment of the present disclosure, in the direction perpendicular to the substrate 10, a sum of the sizes of the first metal layer 213, the second metal layer 214 and the third metal layer 215 is 6550 Å, where the size of the first metal layer 213 is 550 Å, the size of the second metal layer 214 is 5500 Å and the size of the third metal layer 215 is 550 Å. In an embodiment of the present disclosure, the structure layer 30 further includes an organic light-emitting material 32 and an electrode structure 35 located on the substrate 10. The first organic structure 31 and the second inorganic structure 33 are insulated from each other. As shown in FIG. 9, the electrode structure 35 is located at a side of the organic light-emitting material 32 away from the substrate 10, the first organic structure 31 is located at a side of the electrode structure 35 away from the substrate 10, and the second inorganic structure 33 is located at a side of the first organic structure 32 away from the substrate 10; or, as shown in FIG. 9C, the electrode structure 35 is located at a side of the organic light-emitting material 32 away from the substrate 10, and the second inorganic structure 33 is located at a side of the electrode structure 35 away from the substrate 10, and the first organic structure 31 is located a side of the second inorganic structure 33 away from the substrate 10. The structure layer 30 includes four different materials so as to contribute to reduce a height difference of the peripheral region 103 and the isolation region 102. The organic light-emitting material 32 includes at least one of an electron injection layer, an electron transport layer, a hole injection layer and a hole transport layer.

In an embodiment of the present disclosure, in the direction perpendicular to the substrate 10, the size of the first organic structure 31 is in a range of 2 µm-4 µm. In an exemplary embodiment of the present disclosure, in the direction perpendicular to the substrate 10, the size of the first organic structure 31 may be 2.35 µm. In an embodiment of the present disclosure, the electrode structure 35, the electrode material 291 and the second electrode layer 58 are disposed in a same layer and formed in a same process.

In an embodiment of the present disclosure, the organic light-emitting material layer 57 in the display region 101, the organic light-emitting structure 26 in the isolation region 102 and the organic light-emitting material 32 in the structure layer 30 are disposed in a same layer and formed in a same process.

In an embodiment of the present disclosure, the first organic structure 31 surrounds the hole and is continuous without disconnection. In this way, when a protective film is attached, a height difference between each of regions located in the peripheral region 103 and in the isolation region 102 becomes smaller, contributing to avoid bubble from being generated during attaching the protective film.

In another embodiment of the present disclosure, the first organic structure 31 surrounds the hole with a spacing therebetween. In this way, the first organic structure 31 can reduce a size of the bubbles generated during attaching the protective film, contributing to removal of the bubbles during a subsequent bubble-removing process.

Herein, the first organic structure surrounds the hole and is continuous without disconnection, which means that the first organic structure surrounds the hole and there is no hollow region or cut inside the first organic structure. The first organic structure surrounds the hole with a spacing therebetween, which means that the first organic structure surrounds the hole and at the same time, there is a hollow region or cut inside the first organic structure, for example, a hollow region along a circumferential direction or a cut along a radial direction or the like.

In an embodiment of the present disclosure, the first organic structure 31 has the same material as that of the planarization layer 55.

Figure 5:
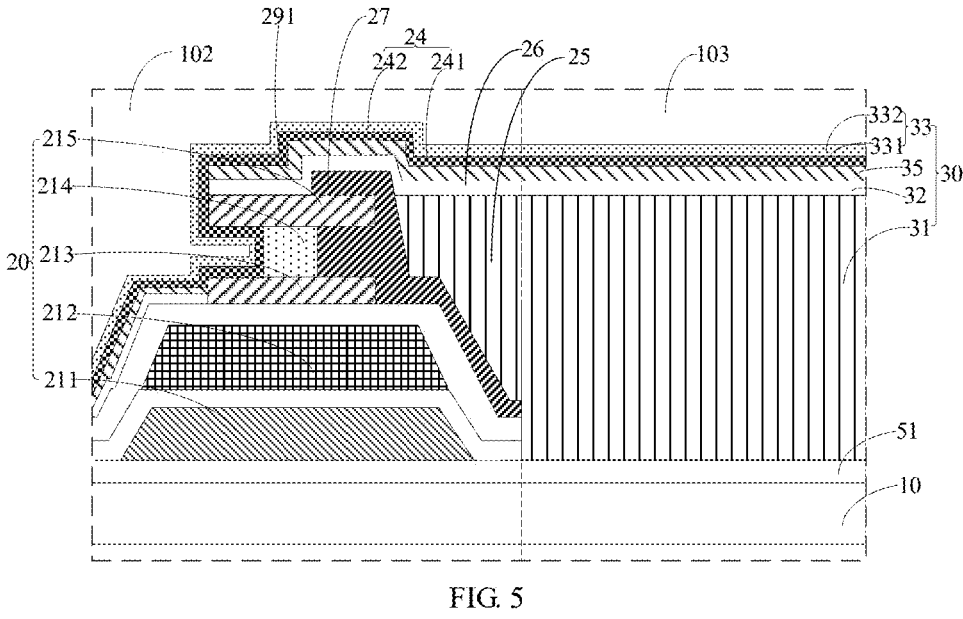
FIG. 5 illustrates a partially enlarged diagram of the display substrate shown in FIG. 3.

Furthermore, with reference to FIG. 5, the organic light-emitting material 32 is located at a side of the first organic structure 31 away from the substrate 10, and the first organic structure 31 and the planarization layer 55 are formed in one patterning process, which contributes to simplify the preparation process. In other embodiments, the first organic structure 31 and the planarization layer 55 may not be formed in a same process.

In another embodiment of the present disclosure, the first organic structure 31 has the same material as that of the pixel defining layer 56.

Figures 7, 8:
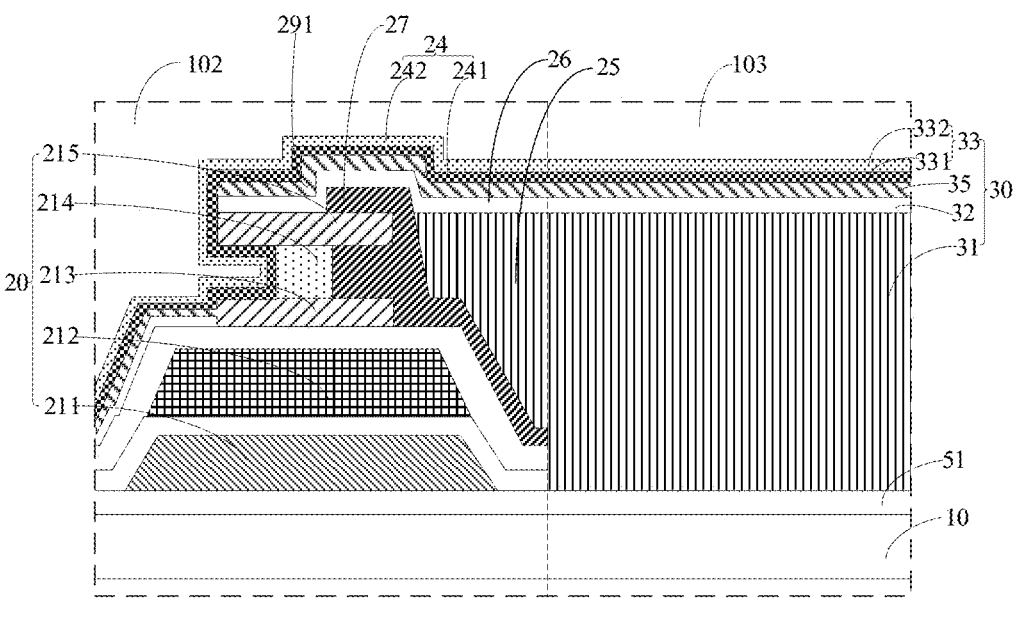
FIG. 7 illustrates a partially enlarged diagram of the display substrate shown in FIG. 6.
FIG. 8 illustrates a partial sectional view of a display substrate according to yet another embodiment of the present disclosure.

Furthermore, with reference to FIG. 7, the organic light-emitting material 32 is located at a side of the first organic structure 31 away from the substrate 10, and the first organic structure 31 and the pixel defining layer 56 are formed in one patterning process, which contributes to simplify the preparation process. In other embodiments of the present disclosure, the first organic structure 31 and the pixel defining layer 56 may not be formed in a same process.

In another embodiment of the present disclosure, with reference to FIG. 9, the first organic structure 31 is located at a side of the organic light-emitting material 32 away from the substrate 10. The first organic structure 31 may be formed in a separate process so as to control a height of the first organic structure 31, thus reducing the height difference between the peripheral region 103 and the isolation region 102. The first organic structure 31 may be identical in material to the planarization layer 55 or the pixel defining layer 56, or identical in material to the organic light-emitting material layer 57.

In an embodiment of the present disclosure, the second organic structure 25 of the isolation region 102 and the first organic structure 31 are continuous and disposed in a same layer. In this case, the second organic structure 25 and the first organic structure 31 may be formed in one patterning process, contributing to simplify the preparation process.

In an embodiment of the present disclosure, the isolation column 20 is located on the substrate 10, and in the direction perpendicular to the substrate 10, the size of the first organic structure 31 is greater than that of the second organic structure 25. Furthermore, in a direction of the hole 104 pointing to the display region 101, the size of the first organic structure 31 along the direction perpendicular to the substrate 10 gradually decreases, the size of the second organic structure 25 along the direction perpendicular to the substrate 10 also gradually decreases, and a minimum size of the first organic structure 31 is greater than a maximum size of the second organic structure 25. In this way, it is more advantageous to reduce a height difference between a region of the isolation region 102 adjoining the peripheral region 103 and the peripheral region 103 and a height difference between the film layers in the hole before cutting hole and the peripheral region 103. In other embodiments of the present disclosure, the isolation column 20 and the substrate 10 are integrally formed, and in the direction perpendicular to the substrate 10, the size of the first organic structure 31 is smaller than that of the second organic structure 25.

In an embodiment of the present disclosure, as shown in FIGS. 7 and 9, the second inorganic structure 33 includes a third inorganic film 331 and a fourth inorganic film 332 located on the third inorganic film 331; the third inorganic film 331 and the first inorganic film 241 are disposed in a same layer; the fourth inorganic film 332 and the second inorganic film 242 are disposed in a same layer. The third inorganic film 331 is a part of the first inorganic material layer 811 located in the peripheral region 103, and the fourth inorganic film 332 is a part of the second inorganic material layer 813 located in the peripheral region 103.

In an embodiment of the present disclosure, the hole 104 exposes side walls of each of the film layers of the structure layer 30. That is, the hole 104 exposes the side walls of the first organic structure 31, the side walls of the organic light-emitting material 32 and the side walls of the second inorganic structure 33 in the structure layer 30.

In an embodiment of the present disclosure, the side walls of various film layers of the structure layer 30 are flushed with each other. That is, the side wall of the first organic structure 31, the side wall of the organic light-emitting material 32 and the side wall of the second inorganic structure 33 in the structure layer 30 are flushed with each other. The structure layer 30 is formed by film layers left during the hole-cutting process, and therefore, the side walls of each of the film layers of the structure layer 30 are flushed with each other.

In an embodiment of the present disclosure, a difference between a distance from a surface of the structure layer 30 away from the substrate 10 to the substrate 10 and a maximum distance from a surface, away from the substrate 10, of the first inorganic structure 24 located above the isolation column 20 to the substrate 10 is in a range of [−1 μm, 1 μm]. In this way, the height difference between the peripheral region 103 and the isolation region 102 becomes smaller, which contributes to avoid bubble from being generated or reduce a volume of the generated bubbles during attaching the protective film. The difference between the distance from the surface of the structure layer 30 away from the substrate 10 to the substrate 10 and the maximum distance from the surface of the first inorganic structure 24 away from the substrate 10 to the substrate 10 may be, for example, −1 μm, −0.8 μm, −0.5 μm, −0.2 μm, 0 μm, 0.2 μm, 0.5 μm, 0.7 μm, 1.0 μm and the like.

In some embodiments of the present disclosure, the difference between the distance from the surface of the structure layer 30 away from the substrate 10 to the substrate 10 and the maximum distance from the surface of the first inorganic structure 24 away from the substrate 10 to the substrate 10 is zero, that is, the surface of the structure layer 30 away from the substrate 10 and the surface of the first inorganic structure 24 away from the substrate 10 are flushed with each other. In this way, when a protective film is attached, there are almost no bubbles generated in the peripheral region 103, which is more advantageous to improve the encapsulation performance and the display effect of the display substrate.

In the embodiments of FIGS. 3-9, the thin film transistor of the display substrate includes a single layer of signal traces. In other embodiments of the present disclosure, the thin film transistor of the display substrate may include double layers of signal traces, where the isolation column may be formed together with any one layer of signal traces synchronously.

In the embodiments of FIGS. 3-9, the isolation column and the signal traces of the thin film transistor are formed at the same time. In other embodiments of the present disclosure, the isolation column may also be formed together with other film layers synchronously. With reference to FIG. 9A, an isolation column 20' includes a planarization material layer 55' and a material layer 27' located at a side of the planarization material layer 55' away from the substrate 10. The planarization material layer 55' and the material layer 27' have etch selectivity ratios different from each other, an isolation groove 51' penetrating through the material layer 27' and a part of the planarization material layer 55' is formed between adjacent isolation columns 20', an orthographic projection of a groove opening of the isolation groove 51' on the substrate is located within an orthographic projection of the isolation groove 51' on the substrate, that is, a recess structure is formed at the side wall of the isolation column 20', such that the organic light-emitting material 26' and the electrode material 291' are discontinued at the side wall of the isolation column 20'. A first inorganic film 241' and a second inorganic film 242' of a first inorganic structure 24' are not discontinued at the side wall of the isolation column 20'. The material layer 27' may have the same material as the passivation layer in the display region. In this case, the material layer 27' and the passivation layer in the display region may be formed in one patterning process. Alternatively, the material layer 27' may be formed by another process, for example, the material layer 27' and the first electrode layer in the display region may be formed at the same time.

In an embodiment of the present disclosure, as shown in FIG. 9A, a structure layer 30' in the peripheral region 103 includes a first organic structure 31', an organic light-emitting material 32', an electrode structure 35' and a second inorganic structure 33'. The second inorganic structure 33' includes a third inorganic film 331' and a fourth inorganic film 332' located at a side of the third inorganic film 331' away from the substrate. The first inorganic film 241' and the third inorganic film 331' may be disposed in a same layer and the second inorganic film 242' and the fourth inorganic film 332' may be disposed in a same layer.

In the illustrated embodiment, the organic light-emitting material 32' is located at a side of the first organic structure 31' away from the substrate 10, the electrode structure 35' is located at a side of the organic light-emitting material 32' away from the substrate 10, and the second inorganic structure 33' is located at a side of the electrode structure 35' away from the substrate 10. The first organic structure 31' may be formed together with the planarization layer in the display region in one patterning process, or together with the pixel defining layer in the display region in one patterning process. In other embodiments of the present disclosure, the first organic structure may also be located between the electrode structure and the second inorganic structure.

An embodiment of the present disclosure further provides a display substrate. The display substrate includes a display region, an isolation region, a peripheral region and a hole. The isolation region adjoins the display region and the peripheral region, and the peripheral region surrounds and adjoins the hole; the display region surrounds the hole. An isolation column is formed at a side of the substrate and located in the isolation region. As shown in FIG. 9C, the isolation column 20 is located on the substrate and in other embodiments, the isolation column 20 and the substrate 10 may also be integrally formed. The peripheral region 103 is provided with a structure layer 30 located on the substrate 10, the structure layer 30 includes a second inorganic structure 33 and a first organic structure 31, and the first organic structure 31 is located at a side of the second inorganic structure 33 away from the substrate 10. The first organic structure 31 and the second inorganic structure 33 both are made of insulation material.

In the display substrate provided by embodiments of the present disclosure, the structure layer 30 of the peripheral region 103 is formed on the substrate 10 and includes the first organic structure 31 and the second inorganic structure 33, such that the thickness of the structure layer 30 is increased, and thus a height difference between the peripheral region 103 and the isolation region 102 is decreased. In this case, when a protective film is attached, bubbles will not be easily generated or the generated bubbles are small, and thus the problem that film layers may be stripped due to entry of the bubbles into the film layers adjacent to the hole 104 during the hole-cutting process can be improved, thus improving the performance of the display substrate 100 to block water and oxygen and contributing to increase the service life of the display substrate 100. At the same time, bubbles can be prevented from entering the film layers of the display region, thereby improving the display effect.

In an embodiment of the present disclosure, the display substrate may further include an organic planarization structure located on the display region, the isolation region 102 and the peripheral region 103. The organic planarization structure is configured to planarize a touch module and/or a filtering module located on a side of the organic planarization structure away from the substrate 10. The organic planarization structure and the first organic structure 31 are integrally formed.

In an embodiment of the present disclosure, the first organic structure 31 and the organic planarization structure may be formed in one process, or the first organic structure 31 and the organic planarization structure may be formed in different processes.

The other structures of the display substrate shown in FIG. 9C are similar to those of the display substrates shown in FIGS. 1-9B. Those relevant descriptions for the display substrates shown in FIGS. 1-9B, which are not in conflict with the structures of the display substrate shown in FIG. 9C, may be applicable to the display substrate shown in FIG. 9C, and reference may be made to relevant descriptions of the display substrates of FIGS. 1-9B and no redundant descriptions are made herein.

Figure 9D:
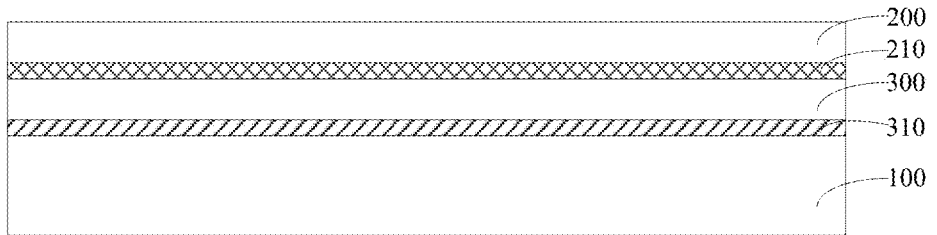
FIG. 9D illustrates a structural schematic diagram of a display apparatus according to an embodiment of the present disclosure.
Figure 9E:
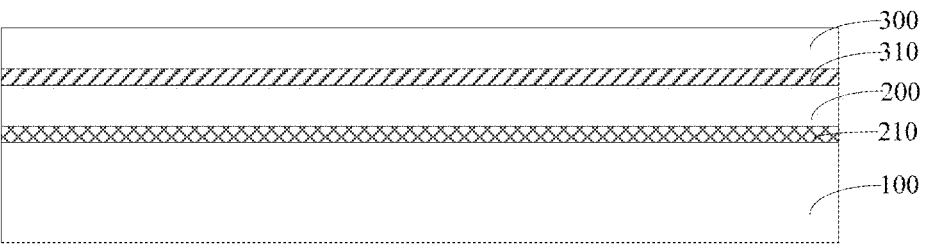
FIG. 9E illustrates a structural schematic diagram of a display substrate according to another embodiment of the present disclosure.

At least one embodiment of the present disclosure further provides a display apparatus. As shown in FIG. 9D or 9E, the display apparatus includes the display substrate 100 shown in FIG. 9C and a functional module. The functional module includes a touch module 200 and a filtering module 300. The functional module is located at a side of the display substrate 100 away from the substrate. In the embodiments of FIGS. 9D and 9E, the functional module includes a touch module 200 and a filtering module 300. In other embodiments of the present disclosure, the functional module may include only one of the touch module 200 and the filtering module 300.

In an embodiment of the present disclosure, the functional module includes a touch module 200 which is an externally-mounted touch module and therefore, the display apparatus further includes a first adhesive layer 210 at a side of the touch module 200 close to the display substrate 100; and/or the functional module includes a filtering module 300 which is a polarizer and the display apparatus further includes a second adhesive layer 310 at a side of the filtering module 300 close to the display substrate 100.

In the embodiment of FIG. 9D, the touch module 200 is disposed at a side of the filtering module 300 away from the display substrate 100, the first adhesive layer 210 is configured to bond the touch module 200 and the filtering module 300 together, and the second adhesive layer 310 are configured to bond the filtering module 300 and the display substrate 100 together. In the embodiment shown in FIG. 9E, the filtering module 300 is disposed at a side of the touch module 200 away from the display substrate 100, the first adhesive layer 210 is configured to bond the touch module 200 and the display substrate 100 together and the second adhesive layer 310 is configured to bond the filtering module 300 and the touch module 200 together.

In other embodiments of the present disclosure, in a case that the touch module 200 has a flexible metal touch structure, the display apparatus does not include the first adhesive layer 210. In a case that the filtering module 300 is a color filter, the display apparatus does not include the second adhesive layer 310.

At least one embodiment of the present disclosure further provides a method for manufacturing a display substrate. Reference will be made below by a manufacturing process of a display substrate. The term of "patterning process" mentioned in the embodiments of the present disclosure includes depositing film layers, coating photoresist, exposing with mask, development, etching and removing photoresist and the like. The deposition may adopt one or more of sputtering, evaporation and chemical gas deposition, and the etching may adopt one or more of dry etch and wet etch. The term of "thin film" refers to one layer of thin film prepared using a material by deposition or coating on a substrate. If the "thin film" does not require patterning process during the entire preparation process, it may also be referred to as "a layer". When the "thin film" requires patterning process during the entire preparation process, it is called "thin film" before patterning process and called "layer" after patterning process. The "layer" subjected to patterning process includes at least one "pattern".

The display substrate includes a display region, an isolation region, a peripheral region, a cutting region and a hole region. The isolation region adjoins the display region and the peripheral region, the cutting region adjoins the peripheral region and the hole region, and the display region surrounds the hole region. As shown in FIG. 10, the method for manufacturing a display substrate includes the following steps S110-S150.

At step S110, a substrate is provided.

In an embodiment of the present disclosure, the substrate may include a flexible matrix layer, a barrier layer and a buffer layer. In some embodiments of the present disclosure, the substrate includes a flexible matrix layer, a barrier layer located at a side of the flexible matrix layer and a buffer layer disposed at a side of the barrier layer away from the flexible matrix layer. In other embodiments of the present disclosure, the substrate 10 may only include a flexible matrix layer, or the substrate 10 may include a first flexible matrix layer, a first barrier layer located at a side of the first flexible matrix layer, a second flexible matrix layer located at a side of the first barrier layer away from the first flexible matrix layer, a second barrier layer located at a side of the second flexible matrix layer away from the first barrier layer and a buffer layer located at a side of the second barrier layer away from the first barrier layer.

At step S120, an isolation column is formed in the isolation region, and a thin film transistor and a capacitor are formed in the display region.

A first intermediate structure as shown in FIG. 11 may be obtained through step S120. As shown in FIG. 11, the display substrate includes a display region 101, an isolation region 102, a peripheral region 103, a cutting region 1041 and a hole region 1042.

In an embodiment of the present disclosure, forming the isolation column 20 in the isolation region 102 includes:

forming a first film layer 211 surrounding the hole region 1042 at a side of the substrate 10; forming a second film layer 212 surrounding the hole region 1042 at a side of the first film layer 211 away from the substrate 10; forming a first metal layer 213, a second metal layer 214 and a third metal layer 215 sequentially at a side of the second film layer 212 away from the substrate 10; wherein an external boundary of an orthographic projection of the second metal layer 214 on the substrate 10 is located within an external boundary of an orthographic projection of the first metal layer 213 on the substrate 10 and within an external boundary of an orthographic projection of the third metal layer 215 on the substrate 10; the orthographic projections of the first metal layer 213 and the third metal layer 215 on the substrate 10 are respectively located within an orthographic projection of the first film layer 211 on the substrate 10 and within an orthographic projection of the second film layer 212 on the substrate 10.

In an embodiment of the present disclosure, forming the isolation column 20 includes: forming at least two isolation columns 20 surrounding the peripheral region 103. By forming the at least two isolation columns 20, it is more advantageous to prevent water and oxygen in air from entering the display region 101 through an organic light-emitting material. In the embodiment shown in FIG. 11, four isolation columns 20 surrounding the peripheral region 103 are formed. In other embodiments of the present disclosure, the number of the isolation columns 20 may be different from four, for example, may be 5 or 7 or the like.

In an embodiment of the present disclosure, forming the thin film transistor and the capacitor in the display region includes: forming a gate electrode 72 and a first pole plate 821 on the substrate 10; forming a second pole plate 822 at a side of the first pole plate 821 away from the substrate 10; forming a source electrode 73 and a drain electrode 74 at a side of the gate electrode 72 away from the substrate 10, where the first pole plate 821 and the second pole plate 822 form the capacitor.

In an embodiment of the present disclosure, forming the source electrode and the drain electrode of the thin film transistor at a side of the gate electrode away from the substrate includes: forming a fourth metal layer 731 at a side of the gate electrode 72 away from the substrate 10, a fifth metal layer 732 at a side of the fourth metal layer 731 away from the substrate 10, and a sixth metal layer 733 at a side of the fifth metal layer 732 away from the substrate 10.

In an embodiment of the present disclosure, forming the first film layer 211 surrounding the hole region 1042 at a side of the substrate 10 and forming the gate electrode 72 and the first pole plate 821 at a side of the substrate 10 are performed synchronously so as to simplify the preparation process.

In an embodiment of the present disclosure, forming the second film layer 212 surrounding the hole region 1042 at a side of the first film layer 211 away from the substrate 10 and forming the second pole plate 822 at a side of the first pole plate 821 away from the substrate 10 are performed synchronously, so as to simplify the preparation process.

In an embodiment of the present disclosure, forming the first metal layer 213 at a side of the second film layer 212 away from the substrate 10, forming the second metal layer 214 at a side of the first metal layer 213 away from the substrate 10 and forming the third metal layer 215 at a side of the second metal layer 214 away from the substrate 10 are performed in synchronization with forming the fourth metal layer 731 at a side of the gate electrode 72 away from the substrate 10, forming the fifth metal layer 732 at a side of the fourth metal layer 731 away from the substrate 10 and forming the sixth metal layer 733 at a side of the fifth metal layer 732 away from the substrate 10. That is, the first metal layer 213 and the fourth metal layer 731 are same in material and located in a same layer, the second metal layer 214 and the fifth metal layer 732 are same in material and located in a same layer, and the third metal layer 215 and the sixth metal layer 733 are same in material and located in a same layer. In this way, it is advantageous to simplify the preparation process. The material of the fourth metal layer 731 and the first metal layer 213 may be a metal titanium, the material of the fifth metal layer 732 and the second metal layer 214 may be a metal aluminum, and the material of the sixth metal layer 733 and the third metal layer 215 may be a metal titanium.

In an exemplary embodiment of the present disclosure, forming the isolation column in the isolation region and forming the thin film transistor and the capacitor in the display region may include the followings:

An active layer thin film is deposited on the substrate 10 and the active layer thin film is then patterned through a patterning process so as to form an active layer 71 in the display region 101.

Next, a gate insulation layer 51 and a first metal thin film are deposited in sequence, and the first metal thin film is patterned through a patterning process, such that the gate electrode 72 and the first pole plate 821 are formed in the display region and the first film layer 211 is formed in the isolation region 102.

Next, a capacitor insulation layer 52 and a second metal thin film are deposited in sequence, and the second metal thin film is then patterned through a patterning process, such that the second pole plate 822 is formed in the display region 101 and the second film layer 212 is formed in the isolation region 102. The second pole plate 822 corresponds in position to the first pole plate 821.

Next, an inter-layer dielectric layer 53 is deposited, and the inter-layer dielectric layer 53, the capacitor insulation layer 52 and the gate insulation layer 51 are etched such that through holes penetrating through the gate insulation layer 51, the capacitor insulation layer 52 and the inter-layer dielectric layer 53 are formed in the display region 101 and a plurality of through holes are formed correspondingly on the active layer 71.

Next, a third metal thin film, a fourth metal thin film and a fifth metal thin film are deposited in sequence, and then, the third metal thin film, the fourth metal thin film and the fifth metal thin film are patterned through a patterning process, such that a source electrode 73 and a drain electrode 74 are formed in the display region 101 and a first metal layer 213, a second metal layer 214 and a third metal layer 215 are formed in the isolation region 102, where the source electrode 73 and the drain electrode 74 are electrically connected with the active layer 71 via the through holes respectively.

At step S130, an intermediate layer is formed, a structure film layer is formed in the isolation region, a structure material layer is formed in the peripheral region and the cutting region, a light-emitting unit is formed in the display region, and a barrier wall structure is formed in the hole region.

The structure material layer includes at least a first organic structure which is made of an insulation material.

In the step S130, a second intermediate structure shown in FIGS. 12, 14 and 16 can be obtained.

In an embodiment of the present disclosure, forming the structure film layer in the isolation region includes: forming an organic light-emitting structure 26 in the isolation region 102; forming an electrode material 291 at a side of the organic light-emitting structure 26 away from the substrate 10.

In an embodiment of the present disclosure, forming the intermediate layer includes: forming a passivation protection material at a side of the thin film transistor 70 away from the substrate 10; and forming a planarization layer 55 at a side of the passivation protection material away from the substrate 10.

In some embodiments of the present disclosure, forming the passivation protection material at a side of the thin film transistor 70 away from the substrate 10 includes: at a side of the thin film transistor 70 away from the substrate 10, forming a passivation layer 54 in the display region 101 and a passivation protection layer 27 in the isolation region 102 at the same time, where the passivation protection layer 27 wraps at least parts of a top wall and a side wall of the isolation column 20 close to the peripheral region 103 and covers a region between the isolation column 20 close to the peripheral region 103 and the peripheral region 103.

In an embodiment of the present disclosure, forming the light-emitting unit 60 in the display region 101 includes: forming a first electrode layer 59 at a side of the planarization layer 55 away from the substrate 10 in the display region 101; forming a pixel defining layer 56 at a side of the first electrode layer 59 away from the substrate 10 in the display region 101, where a plurality of openings are disposed in the pixel defining layer 56; forming an organic light-emitting material layer 57 in the display region; forming a second electrode layer 58 at a side of the organic light-emitting material layer 57 away from the substrate 10 in the display region 101.

In an embodiment of the present disclosure, the step S130 further includes: forming a barrier wall in the isolation region where the barrier wall is located at a side of the isolation column 20 close to the display region 101.

In some embodiments of the present disclosure, forming the barrier wall in the isolation region 101 includes: forming a first barrier wall 22 close to the display region 101 and a second barrier wall 23 away from the display region 101, where a distance from a surface of the second barrier wall 23 away from the substrate 10 to the substrate 10 is greater than a distance from a surface of the first barrier wall 22 away from the substrate 10 to the substrate 10.

In some embodiments of the present disclosure, as shown in FIG. 12, forming the first barrier wall 22 close to the display region 101 and the second barrier wall 23 away from the display region 101 includes: forming a third partition portion 231 between the isolation column 20 and the display region 101; at the same time, forming a fourth partition portion 232 at a side of the third partition portion 231 away from the substrate 10 and forming the first barrier wall 22 between the third partition portion 231 and the display region 101.

In an embodiment of the present disclosure, the step S130 further includes: forming a second organic structure 25 overlapping with the passivation protection layer 27 in the isolation region 102. In an embodiment of the present disclosure, as shown in FIG. 13, forming the structure material layer 34 in the peripheral region 103 and the cutting region 1041 includes: forming a first organic structure 31 in the peripheral region 103 and the cutting region 1041; forming an organic light-emitting material 32 at a side of the first organic structure 31 away from the substrate 10 in the peripheral region 103 and the cutting region 1041 and forming an electrode structure 35 at a side of the organic light-emitting material 32 away from the substrate 10 in the peripheral region 103 and the cutting region 1041.

In some embodiments of the present disclosure, forming the organic light-emitting structure 26 in the isolation region 102, forming the organic light-emitting material 32 at the side of the first organic structure 31 away from the substrate 10 in the peripheral region 103 and the cutting region 1041 and forming the organic light-emitting material layer 57 in the display region 101 are performed synchronously.

Figure 17:
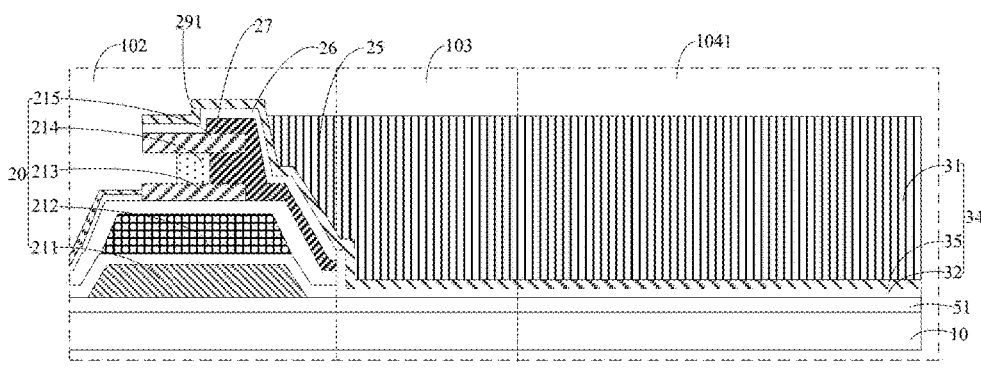
FIG. 17 illustrates a partially enlarged diagram of the second intermediate structure shown in FIG. 16.

In another embodiment of the present disclosure, as shown in FIGS. 16 and 17, forming the structure material layer 34 in the peripheral region 103 and the cutting region 1041 includes: forming the organic light-emitting material 32 in the peripheral region 103 and the cutting region 1041; forming the electrode structure 35 at a side of the organic light-emitting material 32 away from the substrate 10 in the peripheral region 103 and the cutting region 1041; forming the first organic structure 31 at a side of the electrode structure 35 away from the substrate 10 in the peripheral region 103 and the cutting region 1041.

In some embodiments of the present disclosure, forming the organic light-emitting structure 26 in the isolation region 102, forming the organic light-emitting material 32 in the peripheral region 103 and the cutting region 1041 and forming the organic light-emitting material layer 57 in the display region 101 are performed synchronously.

In an embodiment of the present disclosure, forming the barrier wall structure in the hole region 1042 includes: in the hole region 1042, forming a first barrier wall structure 41 close to the cutting region 1041 and a second barrier wall structure away from the cutting region 1041, where a distance from a surface of the second baffle structure 42 away from the substrate 10 to the substrate 10 is smaller than a distance from a surface of the first barrier wall structure 41 away from the substrate 10 to the substrate 10.

In an embodiment of the present disclosure, forming the first barrier wall structure 41 close to the cutting region 1041 and the second barrier wall structure away from the cutting region 1041 in the hole region 1042 includes: forming a first partition portion 411 in the hole region 1042; at the same time, forming a second partition portion 412 at a side of the first partition portion 411 away from the substrate 10 and forming the second barrier wall structure 42 at a side of the first partition portion 411 away from the cutting region 1041.

In an embodiment of the present disclosure, forming the first partition portion 411 in the hole region 1042 and forming the planarization layer 55 at a side of the passivation protection material away from the substrate 10 are performed synchronously; forming the second partition portion 412 at a side of the first partition portion 411 away from the substrate 10 and forming the second barrier wall structure 42 at a side of the first partition portion 411 away from the cutting region 1041 at the same time are performed in synchronization with forming the pixel defining layer 56 at a side of the first electrode layer 59 away from the substrate 10 in the display region 101.

In an embodiment of the present disclosure, forming the third partition portion 231 between the isolation column 20 and the display region 101 and forming the planarization layer 55 at a side of the passivation protection material away from the substrate 10 are performed synchronously; forming the fourth partition portion 232 at a side of the third partition portion 231 away from the substrate 10 and forming the first barrier wall 22 between the third partition portion 231 and the display region 101 at the same time are performed in synchronization with forming the pixel defining layer 56 at a side of the first electrode layer 59 away from the substrate 10 in the display region 101.

In some embodiments of the present disclosure, forming the second organic structure 25 and forming the first organic structure 31 are performed synchronously.

In an embodiment of the present disclosure, in the direction perpendicular to the substrate 10, a size of a part of the first organic structure 31 located in the cutting region 1041 is greater than a size of a part of the first organic structure 31 located in the peripheral region 103, the size of the part of the first organic structure 31 located in the peripheral region 103 is greater than a size of the second organic structure 25, and in a direction in which the hole region 1042 points to the display region 101, the first organic structure 31 gradually decreases in size and the second organic structure 25 also gradually decreases in size, where a minimum size of the first organic structure 31 is greater than a maximum size of the second organic structure 25. With such disposal, a segment difference between the cutting region 1041 and the hole region 1042 and a segment difference between the peripheral region 103 and the isolation region 102 both become smaller, such that bubbles will not be easily generated or the generated bubbles are small during attaching the protective film.

In an embodiment of the present disclosure, forming the electrode material 291 at a side of the organic light-emitting structure 26 away from the substrate 10 in the isolation region 102, forming the electrode structure 35 at a side of the organic light-emitting material 32 away from the substrate 10 in the peripheral region 103 and the cutting region 1041 and forming the second electrode layer 58 at a side of the organic light-emitting material layer 57 away from the substrate 10 in the display region 101 are all performed synchronously.

In some embodiments of the present disclosure, as shown in FIGS. 12 and 13, the organic light-emitting material 32 is located at a side of the first organic structure 31 away from the substrate 10, and forming the planarization layer 55 at a side of the passivation protection material away from the substrate 10 in the display region 101 and forming the first organic structure 31 in the peripheral region 103 and the cutting region 1041 are both performed synchronously, thus contributing to simplify the preparation process.

In an exemplary embodiment of the present disclosure, when forming the planarization layer 55 at a side of the passivation protection material away from the substrate 10 in the display region 101 and forming the first organic structure 31 in the peripheral region 103 and the cutting region 1041 are both performed synchronously, the step S130 may include the followings:

A passivation material thin film is deposited on the source electrode 73 and the drain electrode 74 and then patterned through a patterning process to form a passivation layer 54 in the display region 101 and a passivation protection layer 27 in the isolation region 102. In order to reduce cracks generated during cutting and hole opening process and prevent the cracks from propagating to the display region 101, when the passivation material thin film in the cutting region 1041 and the peripheral region 103 is etched during a patterning process, one or more of the inter-layer dielectric layer 53, the capacitor insulation layer 52 and the gate insulation layer 51 may be etched at the same time. As shown in FIG. 13, after patterning is performed for the passivation material thin film, the inter-layer dielectric layer 53 and the capacitor insulation layer 52 in the cutting region 1041 and the peripheral region 103 are etched off while the gate insulation layer 51 is retained. In other embodiments, the inter-layer dielectric layer 53, the capacitor insulation layer 52 and the gate insulation layer 51 in the cutting region 1041 and the peripheral region 103 are all etched off. Alternatively, in the cutting region 1041 and the peripheral region 103, only the inter-layer dielectric layer 53 is etched off and the capacitor insulation layer 52 and the gate insulation layer 51 are retained.

Next, a planarization thin film is deposited and then patterned through a patterning process so as to form the planarization layer in the display region 101, form the third partition portion 231 and the second organic structure 25 in the isolation region 102, form the first organic structure 31 in the peripheral region 103 and the cutting region 1041 and form the first partition portion 411 in the hole region 1042.

Next, the planarization layer 55 and the passivation layer 54 are etched to form a contact hole penetrating through the planarization layer 55 and the passivation layer 54 where the contact hole corresponds to the drain electrode 74.

Next, a sixth metal thin film is deposited and then patterned through a patterning process to form the first electrode layer 59 in the display region 101 where the first electrode layer is in electrical connection with the drain electrode 74 via the contact hole.

Next, a pixel defining thin film is deposited and then patterned through a patterning process to form the pixel defining layer in the display region, form the first barrier wall 22 and the fourth partition portion 232 in the isolation region and form the second partition portion 412 and the second barrier wall structure 42 in the hole region 1042.

Next, an organic light-emitting material thin film is deposited so as to form the organic light-emitting structure 26 in the isolation region 102, form the organic light-emitting material 32 in the peripheral region 103 and the cutting region 1041, form the organic light-emitting material 43 in the hole region 1042, and form the organic light-emitting material layer 57 in the display region 101. The organic light-emitting structure 26 in the isolation region 102 includes the organic light-emitting material on the top wall and side wall of the first barrier wall 22 and the second barrier wall 23, the organic light-emitting material on the top wall of the third metal layer 215 and the organic light-emitting material between adjacent first metal layers 213. The organic light-emitting material in the hole region 1042 includes the organic light-emitting material on the top wall and side wall of the first barrier wall structure 41 and the second barrier wall structure 42 and the organic light-emitting material between the first barrier wall structure 41 and the second barrier wall structure 42. In other embodiments, the organic light-emitting structure 26 may be discontinued at the side wall of the first barrier wall 22 and the second barrier wall 23. The organic light-emitting material in the hole region 1042 may be discontinued at the side wall of the first barrier wall structure 41 and the second barrier wall structure 42.

Next, a seventh metal thin film is deposited and then patterned through a patterning process so as to form the second electrode layer 58 in the display region 101, form the electrode material 291 in the isolation region 102, form the electrode structure 35 in the peripheral region 103 and the cutting region 1041, and form the electrode material 292 in the hole region 1042.

In some other embodiments of the present disclosure, as shown in FIGS. 14 and 15, the organic light-emitting material 32 is located at a side of the first organic structure 31 away from the substrate 10, and forming the pixel defining layer 56 at a side of the first electrode layer 59 away from the substrate 10 in the display region 101 and forming the first organic structure 31 in the peripheral region 103 and the cutting region 1041 are both performed synchronously, thus contributing to simplify the preparation process.

In an exemplary embodiment, when forming the pixel defining layer 56 at a side of the first electrode layer 59 away from the substrate 10 in the display region 101 and forming the first organic structure 31 in the peripheral region 103 and the cutting region 1041 are performed synchronously, the step S130 may include the following process:

A passivation material thin film is deposited on the source electrode 73 and the drain electrode 74 and then patterned through a patterning process to form the passivation layer 54 in the display region 101 and the passivation protection layer 27 in the isolation region 102. In order to reduce cracks generated during cutting and hole opening process and prevent the cracks from propagating to the display region 101, when the passivation material thin film in the cutting region 1041 and the peripheral region 103 is etched during a patterning process, one or more of the inter-layer dielectric layer 53, the capacitor insulation layer 52 and the gate insulation layer 51 may be etched at the same time. As shown in FIG. 15, after patterning is performed for the passivation material thin film, the inter-layer dielectric layer 53 and the capacitor insulation layer 52 in the cutting region 1041 and the peripheral region 103 are etched off while the gate insulation layer 51 is retained. In other embodiments, the inter-layer dielectric layer 53, the capacitor insulation layer 52 and the gate insulation layer 51 in the cutting region 1041 and the peripheral region 103 are all etched off. Alternatively, in the cutting region 1041 and the peripheral region 103, only the inter-layer dielectric layer 53 is etched off and the capacitor insulation layer 52 and the gate insulation layer 51 are retained.

Next, a planarization thin film is deposited and then patterned through a patterning process so as to form the planarization layer 55 in the display region 101, form the third partition portion 231 in the isolation region 102, and form the first partition portion 411 in the hole region 1042.

Next, the planarization layer 55 and the passivation layer 54 are etched to form a contact hole penetrating through the planarization layer 55 and the passivation layer 54 where the contact hole corresponds to the drain electrode 74.

Next, a sixth metal thin film is deposited and then patterned through a patterning process to form the first electrode layer 59 in the display region 101 where the first electrode layer 59 is in electrical connection with the drain electrode 74 via the contact hole.

Next, a pixel defining thin film is deposited and then patterned through a patterning process to form the pixel defining layer 56 in the display region 101, form the first barrier wall 22 and the fourth partition portion 232 in the isolation region 102, form the second organic structure 25 in the isolation region 102, form the first organic structure 31 in the peripheral region 103 and the cutting region 1041, and form the second partition portion 412 and the second barrier wall structure 42 in the hole region 1042.

Next, an organic light-emitting material thin film is deposited so as to form the organic light-emitting structure 26 in the isolation region 102, form the organic light-emitting material 32 in the peripheral region 103 and the cutting region 1041, form the organic light-emitting material 43 in the hole region 1042, and form the organic light-emitting material layer 57 in the display region 101. The organic light-emitting structure 26 includes the organic light-emitting material on the top wall and side wall of the first barrier wall 22 and the second barrier wall 23, the organic light-emitting material on the top wall of the third metal layer 215 and the organic light-emitting material between adjacent first metal layers 213. The organic light-emitting material 43 includes the organic light-emitting material on the top wall and side wall of the first barrier wall structure 41 and the second barrier wall structure 42 and the organic light-emitting material between the first barrier wall structure 41 and the second barrier wall structure 42. In other embodiments, the organic light-emitting structure 26 may be discontinued at the side wall of the first barrier wall 22 and the second barrier wall 23. The organic light-emitting material in the hole region 1042 may be discontinued at the side wall of the first barrier wall structure 41 and the second barrier wall structure 42.

Next, a seventh metal thin film is deposited and then patterned through a patterning process so as to form the second electrode layer 58 in the display region 101, form the electrode material 291 in the isolation region 102, form the electrode structure 35 in the peripheral region 103 and the cutting region 1041, and form the electrode material 292 in the hole region 1042.

In another embodiment of the present disclosure, as shown in FIGS. 16 and 17, the first organic structure 31 is formed at a side of the electrode structure 35 away from the substrate 10. Forming the first organic structure 31 at a side of the organic light-emitting material 32 away from the substrate 10 in the peripheral region 103 and the cutting region 1041 is performed after the second electrode layer 58 is formed at a side of the organic light-emitting material layer 57 away from the substrate 10 in the display region 101.

In an exemplary embodiment of the present disclosure, in a case that forming the first organic structure 31 at a side of the organic light-emitting material 32 away from the substrate 10 in the peripheral region 103 and the cutting region 1041 is performed after the second electrode layer 58 is formed at a side of the organic light-emitting material layer 57 away from the substrate 10 in the display region 101, the step S130 may include the followings:

A passivation material thin film is deposited on the source electrode 73 and the drain electrode 74 and then patterned through a patterning process to form the passivation layer 54 in the display region 101 and the passivation protection layer 27 in the isolation region 102. In order to reduce cracks generated during cutting and hole opening process and prevent the cracks from propagating to the display region 101, when the passivation material thin film in the cutting region 1041 and the peripheral region 103 is etched during a patterning process, one or more of the inter-layer dielectric layer 53, the capacitor insulation layer 52 and the gate insulation layer 51 may be etched at the same time. As shown in FIG. 17, after patterning is performed for the passivation material thin film, the inter-layer dielectric layer 53 and the capacitor insulation layer 52 in the cutting region 1041 and the peripheral region 103 are etched off while the gate insulation layer 51 is retained. In other embodiments of the present disclosure, the inter-layer dielectric layer 53, the capacitor insulation layer 52 and the gate insulation layer 51 in the cutting region 1041 and the peripheral region 103 are all etched off. Alternatively, in the cutting region 1041 and the peripheral region 103, only the inter-layer dielectric layer 53 is etched off and the capacitor insulation layer 52 and the gate insulation layer 51 are retained.

Next, a planarization thin film is deposited and then patterned through a patterning process so as to form the planarization layer 55 in the display region 101, form the third partition portion 231 in the isolation region 101 and form the first partition portion 411 in the hole region 1042.

Next, the planarization layer 55 and the passivation layer 54 are etched to form a contact hole penetrating through the planarization layer 55 and the passivation layer 54 where the contact hole corresponds to the drain electrode 74.

Next, a sixth metal thin film is deposited and then patterned through a patterning process to form the first electrode layer 59 in the display region 101 where the first electrode layer is in electrical connection with the drain electrode 74 via the contact hole.

Next, a pixel defining thin film is deposited and then patterned through a patterning process to form the pixel defining layer 56 in the display region 101, form the first barrier wall 22 and the fourth partition portion 232 in the isolation region 102 and form the second partition portion 412 and the second barrier wall structure 42 in the hole region 1042.

Next, an organic light-emitting material thin film is deposited so as to form the organic light-emitting structure 26 in the isolation region 102, form the organic light-emitting material 32 in the peripheral region 103 and the cutting region 1041, form the organic light-emitting material 43 in the hole region 1042, and form the organic light-emitting material layer 57 in the display region 101. The organic light-emitting structure 26 in the isolation region 102 includes the organic light-emitting material on the top wall and side wall of the first barrier wall 22 and the second barrier wall 23, the organic light-emitting material on the top wall of the third metal layer 215 and the organic light-emitting material between adjacent first metal layers 213. The organic light-emitting material in the hole region 1042 includes the organic light-emitting material on the top wall and side wall of the first barrier wall structure 41 and the second barrier wall structure 42 and the organic light-emitting material between the first barrier wall structure 41 and the second barrier wall structure 42. In other embodiments of the present disclosure, the organic light-emitting structure 26 may be discontinued at the side wall of the first barrier wall 22 and the second barrier wall 23. The organic light-emitting material in the hole region 1042 may be discontinued at the side wall of the first barrier wall structure 41 and the second barrier wall structure 42.

Next, a seventh metal thin film is deposited and then patterned through a patterning process so as to form the second electrode layer 58 in the display region 101, form the electrode material 291 in the isolation region 102, form the electrode structure 35 in the peripheral region 103 and the cutting region 1041, and form the electrode material 292 in the hole region 1042.

Next, an organic material thin film is deposited and then patterned through a patterning process to form the second organic structure 25 in the isolation region 102 and form the first organic structure 31 in the peripheral region 103 and the cutting region 1041. In an embodiment of the present disclosure, a difference between a distance from a surface of the structure material layer 34 away from the substrate 10 to the substrate 10 and a distance from a surface of the isolation column 20 away from the substrate 10 to the substrate 10 is in a range of [−1 μm, 1 μm]. In this way, after an encapsulation layer is formed in subsequent process, the segment differences between the peripheral region 103 and the cutting region 1041/the isolation region 102 are smaller, and thus bubbles will not be easily generated during attachment of a protective film.

At step S140, an encapsulation layer is formed in the display region, the isolation region, the peripheral region, the cutting region and the hole region.

Figure 18:
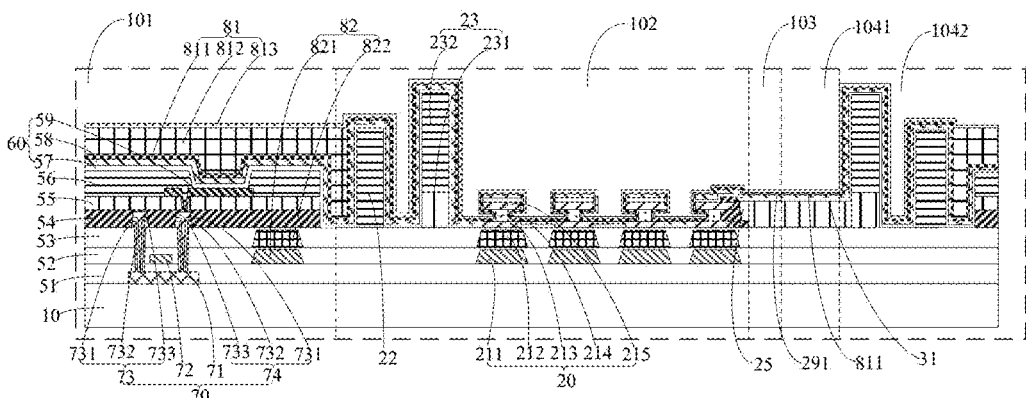
FIG. 18 illustrates a schematic diagram of a third intermediate structure of a display substrate according to an embodiment of the present disclosure.
Figure 19:
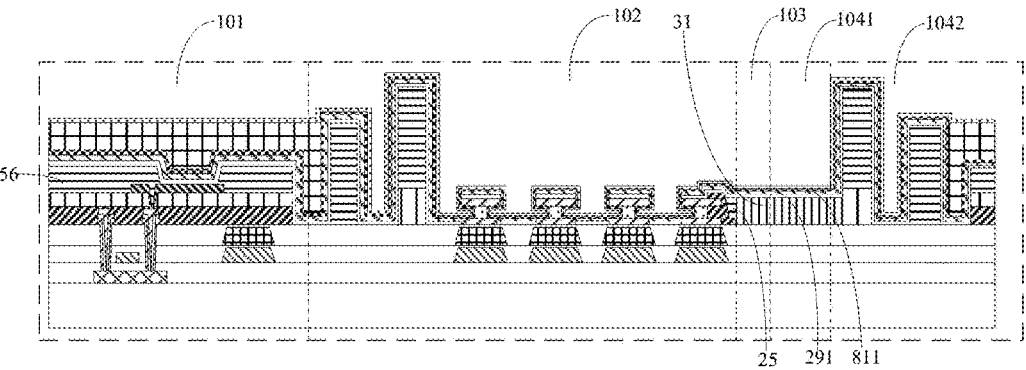
FIG. 19 illustrates a schematic diagram of a third intermediate structure of a display substrate according to another embodiment of the present disclosure.
Figure 20:
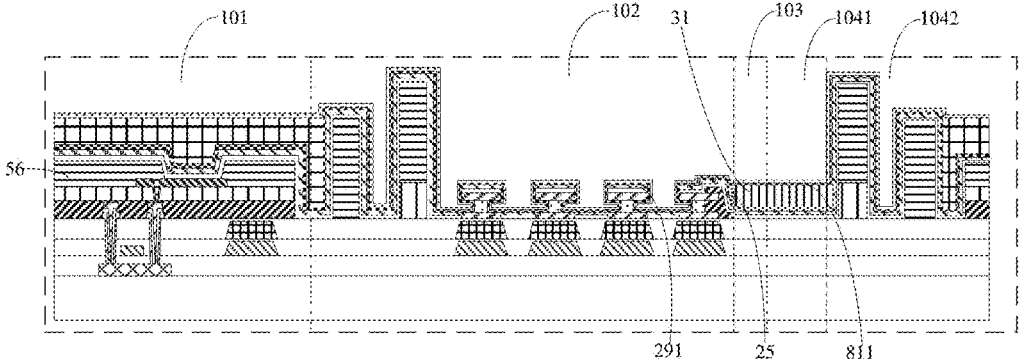
FIG. 20 illustrates a schematic diagram of a third intermediate structure of a display substrate according to yet another embodiment of the present disclosure.

In the step S140, a third intermediate structure as shown in FIG. 18, 19 or 20 may be obtained.

In an embodiment of the present disclosure, forming the encapsulation layer 81 in the display region, the isolation region, the peripheral region, the cutting region and the hole region includes the followings:

Firstly, a first inorganic material layer 811 is formed in the display region 101, the isolation region 102, the peripheral region 103, the cutting region 1041 and the hole region 1042. As shown in FIGS. 18 and 19, the organic light-emitting structure 26 is located at a side of the second organic structure 25 away from the substrate 10, and the first inorganic material layer 811 is in contact with the electrode material 291. As shown in FIG. 20, the second organic structure 25 is located between the electrode material 291 and the first inorganic material layer 811, and the first inorganic material layer 811 is in contact with both the electrode material 291 and the second organic structure 25.

Secondly, in the display region 101, an organic material layer 812 is formed at a side of the first inorganic material layer 811 away from the substrate 10.

Thirdly, in the display region 101, the isolation region 102, the peripheral region 103, the cutting region 1041 and the hole region 1042, a second inorganic material layer 813 is formed at a side of the organic material layer 812 away from the substrate 10.

When a difference between a distance from a surface of the structure material layer 34 away from the substrate 10 to the substrate 10 and a distance from a surface of the isolation column 20 away from the substrate 10 to the substrate 10 is in a range of [−1 μm, 1 μm], after the encapsulation layer 81 is formed, a difference between a distance from a part of the second inorganic material layer 813 in the isolation region 102 to the substrate 10 and a distance from a part of the second inorganic material layer 813 in the peripheral region 103 and the cutting region 1041 to the substrate 10 is in a range of [−1 μm, 1 μm]. In this way, when a protective film is attached, no bubbles can be generated in the cutting region 1041 and the peripheral region 103.

At step S150, the cutting region is cut such that the film layers in the cutting region and the hole region are cut off to form a hole.

Figure 6:
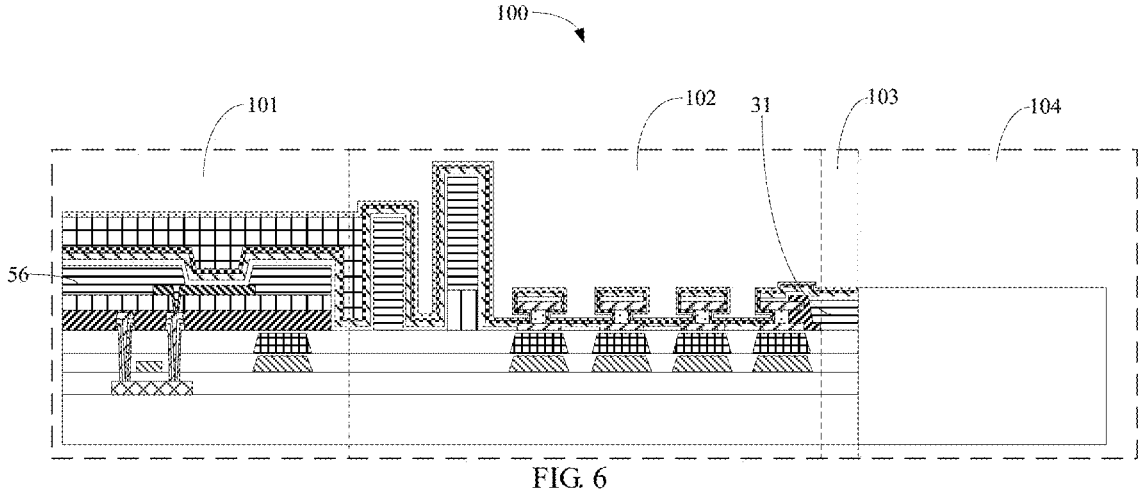
FIG. 6 illustrates a partial sectional view of a display substrate according to another embodiment of the present disclosure.

At step S150, the display substrate as shown in FIG. 3, or 6 or 8 can be obtained.

In an embodiment of the present disclosure, the film layers in the cutting region 1041 may be cut by use of laser light. After the film layers in the cutting region 1041 are cut off, the film layers in the hole region 1042 will be removed along with the film layers of the cutting region 1041, thus forming the hole 104 in the hole region 1042.

In an embodiment of the present disclosure, in a direction parallel to the substrate 10, a ratio of a sum of the sizes of the peripheral region 103 and the cutting region 1041 to the size of the isolation region 102 is in a range of 1-3. In the direction parallel to the substrate 10, the ratio of the sum of the sizes of the peripheral region 103 and the cutting region 1041 to the size of the isolation region 102 may be, for example, 1, 1.5, 2, 2.5 or 3 or the like.

Since the preparation method embodiments basically correspond to the product embodiments, reference may be made to a part of the descriptions of the product embodiments for descriptions of relevant details and beneficial effects, and no redundant descriptions are made herein.

In the method for manufacturing a display substrate according to the embodiments of the present disclosure, the structure material layer formed in the peripheral region 103 includes at least the first organic structure and can reduce the segment difference between the peripheral region 103 and the isolation region 102. In this way, when a protective film is attached, bubbles will not be easily generated or the generated bubbles are small, which helps to avoid the problem that the water and oxygen blocking performance of the display substrate 100 is reduced because bubbles enter the film layers adjacent to the hole to cause the film layers to be stripped during the cutting and hole opening process, thereby increasing the service life of the display substrate 100; at the same time, the problem that the display effect of the display region is reduced due to entry of the bubbles into the film layers of the display region can be improved.

In the sectional view shown by the embodiments of the present disclosure, the structure of the inner isolation column 61 shown in FIG. 2 is not shown. In practical applications, at least one inner isolation column 61 is disposed between the display region 101 and the isolation region 102.

An embodiment of the present disclosure further provides a display panel, including the display substrate 100 according to any one of the above embodiments.

The display panel further includes a glass cover plate located at a side of the display substrate away from the substrate.

An embodiment of the present disclosure further provides a display apparatus including the above display panel. The display apparatus further includes a housing and the display panel may be embedded into the housing.

The display apparatus in the embodiment may be any products or components having display function, such as electronic paper, smart phone, tablet computer, television, laptop computer, digital photo frame and navigator.

It is noted that, in the drawings, the sizes of the layers and regions may be exaggerated for the purpose of clarity of illustrations. Furthermore, it may be understood that when an element or layer is referred as being on another element or layer, this element or layer may be directly on another element or there is an intermediate layer therebetween. In addition, it may be understood that when an element or layer is referred to as being below another element or layer, this element or layer may be directly below another element or there is one or more intermediate layers or elements therebetween. Furthermore, it may also be understood that when a layer or element is referred to as being between two layer or elements, it may be a unique layer between two layers or two elements, or there is one or more intermediate layers or elements. Similar reference numerals throughout the specification indicate similar elements.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and embodiments are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A display substrate, comprising:
a substrate; and,
a display region, an isolation region, a peripheral region and a hole disposed on the substrate,
wherein the display region surrounds the hole, the isolation region is disposed between the display region and the peripheral region, and the peripheral region surrounds and adjoins the hole;
the isolation region is provided with at least one isolation column and a first inorganic structure, the isolation column is disposed at a side of the substrate, and the first inorganic structure is disposed at a side of the isolation column away from the substrate;
the peripheral region is provided with a structure layer, and the structure layer is disposed on the substrate and comprises a first organic structure and a second inorganic structure disposed along a direction perpendicular to the substrate;
each of the first inorganic structure, the second inorganic structure and the first organic structure is made of an insulation material, and the first inorganic structure and the second inorganic structure are configured to encapsulate the display substrate,
wherein the first inorganic structure comprises a first inorganic film and a second inorganic film located at a side of the first inorganic film away from the substrate,
the second inorganic structure comprises a third inorganic film and a fourth inorganic film located at a side of the third inorganic film away from the substrate;

the third inorganic film and the first inorganic film are disposed in a same layer;

the fourth inorganic film and the second inorganic film are disposed in a same layer;

the display substrate further comprises an organic material layer, and the organic material layer is disposed at least in the display region and disposed between the first inorganic film and the second inorganic film;

in the direction perpendicular to the substrate, sizes of the first inorganic film and the second inorganic film are smaller than a size of the organic material layer respectively.

2. The display substrate of claim 1, wherein the structure layer further comprises an organic light-emitting material and an electrode structure;

the first organic structure is disposed on the substrate, the organic light-emitting material is located at a side of the first organic structure away from the substrate, the electrode structure is located at a side of the organic light-emitting material away from the substrate, the second inorganic structure is located at a side of the electrode structure away from the substrate; or, the electrode structure is located at a side of the organic light-emitting material away from the substrate, the first organic structure is located at a side of the electrode structure away from the substrate, and the second inorganic structure is located at a side of the first organic structure away from the substrate; or, the organic light-emitting material and the electrode structure are disposed on the substrate, the electrode structure is located at a side of the organic light-emitting material away from the substrate, the second inorganic structure is located at a side of the electrode structure away from the substrate, and the first organic structure is disposed at a side of the second inorganic structure away from the substrate.

3. The display substrate of claim 1, wherein the isolation region is provided with at least two isolation columns disposed around the peripheral region, and the isolation region is further provided with a passivation protection layer overlapping with one close to the peripheral region of the isolation columns, and the passivation protection layer surrounds at least parts of a top wall and a side wall of the one close to the peripheral region of the isolation columns and covers a region between the one close to the peripheral region of the isolation columns and the peripheral region.

4. The display substrate of claim 3, wherein the isolation region is further provided with a second organic structure overlapping with the passivation protection layer;

in a case that the isolation columns are disposed on the substrate, in the direction perpendicular to the substrate, a size of the first organic structure is greater than a size of the second organic structure; and, in a case that the isolation columns and the substrate are integrally formed, in the direction perpendicular to the substrate, the size of the first organic structure is smaller than the size of the second organic structure.

5. The display substrate of claim 4, wherein the isolation region is further provided with an organic light-emitting structure and an electrode material, the organic light-emitting structure is disposed at a side of the isolation columns away from the substrate, the electrode material is disposed at a side of the organic light-emitting structure away from the substrate, and the first inorganic structure is disposed at a side of the electrode material away from the substrate; or the organic light-emitting structure is located at a side of the second organic structure away from the substrate, and the first inorganic structure is in contact with the electrode material; or, the second organic structure is located between the electrode material and the first inorganic structure, and the first inorganic structure is in contact with both the electrode material and the second organic structure; and, the electrode material and the electrode structure in the structure layer are disposed in a same layer.

6. The display substrate of claim 1, wherein the isolation column comprises a first film layer formed at a side of the substrate, a second film layer located at a side of the first film layer away from the substrate, a first metal layer located at a side of the second film layer away from the substrate, a second metal layer located at a side of the first metal layer away from the substrate, and a third metal layer located at a side of the second metal layer away from the substrate;

wherein, an orthographic projection of the second metal layer on the substrate is located within an orthographic projection of the first metal layer on the substrate and within an orthographic projection of the third metal layer on the substrate, so as to form a groove at a side wall of the isolation column;

the first film layer surrounds the hole, and the orthographic projection of the first metal layer on the substrate and the orthographic projection of the third metal layer on the substrate both are located within an orthographic projection of the first film layer on the substrate;

the second film layer surrounds the hole, and the orthographic projection of the first metal layer on the substrate and the orthographic projection of the third metal layer on the substrate both are located within an orthographic projection of the second film layer on the substrate;

the display region further comprises a thin film transistor and a capacitor, the thin film transistor comprises a gate electrode, a source electrode and a drain electrode, and the capacitor comprises a first pole plate and a second pole plate located at a side of the first pole plate away from the substrate;

the first film layer, the first pole plate and the gate electrode are disposed in a same layer, and the second film layer and the second pole plate are disposed in a same layer; and the drain electrode and the source electrode each comprise a fourth metal layer, a fifth metal layer located at a side of the fourth metal layer away from the substrate and a sixth metal layer located at a side of the fifth metal layer away from the substrate; the first metal layer and the fourth metal layer are disposed in a same layer, the second metal layer and the fifth metal layer are disposed in a same layer, and the third metal layer and the sixth metal layer are disposed in a same layer.

7. The display substrate of claim 1, wherein, the display substrate comprises an organic planarization structure, the organic planarization structure is located in the display region, the isolation region and the peripheral region, the organic planarization structure is configured to planarize a touch module and/or a filtering module located at a side of the first organic structure away from the substrate, and the organic planarization structure and the first organic structure are integrally formed.

8. A display panel, comprising the display substrate of claim 1.

9. A display apparatus, comprising the display panel of claim 8.

10. A display apparatus, comprising one or more functional modules and a display substrate of claim 1, wherein the functional modules are located at a side of the display substrate away from the substrate and comprise at least one of a touch module and a filtering module, in a case that the functional modules comprise a touch module, the display apparatus further comprises a first adhesive layer located at a side of the touch module close to the display substrate; and/or, in a case that the functional modules comprise a filtering module, the display apparatus further comprises a second adhesive layer located at a side of the filtering module close to the display substrate.

11. A method for manufacturing a display substrate, wherein the display substrate comprises a substrate and a display region, an isolation region, a peripheral region, a cutting region and a hole region disposed on the substrate, the display region surrounds the hole region, the isolation region is disposed between the display region and the peripheral region, and the cutting region adjoins the peripheral region and the hole region;

the method comprises:

providing a substrate;

forming an isolation column in the isolation region and forming a thin film transistor and a capacitor in the display region;

forming an intermediate layer, forming a structure film layer in the isolation region, forming a structure material layer in the peripheral region and the cutting region, and forming a light-emitting unit in the display region; wherein the structure material layer at least comprises a first organic structure which is insulated;

forming an encapsulation layer in the display region, the isolation region, the peripheral region, the cutting region and the hole region; and performing cutting in the cutting region such that film layers in the cutting region and the hole region are cut off to form a hole, wherein the encapsulation layer comprises a first inorganic structure that is disposed at a side of the isolation column away from the substrate in the isolation region and a second inorganic structure that is disposed in the peripheral region, wherein the first inorganic structure comprises a first inorganic film and a second inorganic film located at a side of the first inorganic film away from the substrate, the second inorganic structure comprises a third inorganic film and a fourth inorganic film located at a side of the third inorganic film away from the substrate;

the third inorganic film and the first inorganic film are disposed in a same layer;

the fourth inorganic film and the second inorganic film are disposed in a same layer;

wherein the encapsulation layer further comprises an organic material layer, and the organic material layer is disposed at least in the display region and disposed between the first inorganic film and the second inorganic film;

in the direction perpendicular to the substrate, sizes of the first inorganic film and the second inorganic film are smaller than a size of the organic material layer respectively.

12. The method for manufacturing a display substrate of claim 11, wherein forming the structure film layer in the isolation region comprises:

forming an organic light-emitting structure in the isolation region; and forming an electrode material at a side of the organic light-emitting structure away from the substrate;

forming the intermediate layer comprises:

forming a passivation protection material at a side of the thin film transistor away from the substrate; and forming a planarization layer at a side of the passivation protection material away from the substrate;

forming the structure material layer in the peripheral region and the cutting region comprises:

forming a first organic structure in the peripheral region and the cutting region;

forming an organic light-emitting material at a side of the first organic structure away from the substrate in the peripheral region and the cutting region;

forming an electrode structure at a side of the organic light-emitting material away from the substrate in the peripheral region and the cutting region;

forming the light-emitting unit in the display region comprises:

forming a first electrode layer at a side of the planarization layer away from the substrate in the display region;

forming a pixel defining layer at a side of the first electrode layer away from the substrate in the display region wherein a plurality of pixel openings are disposed in the pixel defining layer;

forming an organic light-emitting material layer in the display region;

forming a second electrode layer at a side of the organic light-emitting material layer away from the substrate in the display region, wherein forming the pixel defining layer at the side of the first electrode layer away from the substrate in the display region and forming the first organic structure in the peripheral region and the cutting region are performed synchronously, wherein forming the planarization layer at the side of the passivation protection material away from the substrate and forming the first organic structure in the peripheral region and the cutting region are performed synchronously, wherein forming the organic light-emitting structure in the isolation region, forming the organic light-emitting material at the side of the first organic structure away from the substrate and forming the organic light-emitting material layer in the display region are performed synchronously, and wherein forming the electrode material at the side of the organic light-emitting structure away from the substrate in the isolation region, forming the electrode structure at the side of the organic light-emitting material away from the substrate in the peripheral region and the cutting region and forming the second electrode layer at the side of the organic light-emitting material layer away from the substrate in the display region are performed synchronously.

13. The method for manufacturing a display substrate of claim 11, wherein forming the structure film layer in the isolation region comprises:

forming an organic light-emitting structure in the isolation region; and forming an electrode material at a side of the organic light-emitting structure away from the substrate in the isolation region;

forming the intermediate layer comprises:

forming a passivation protection material at a side of the thin film transistor away from the substrate; and forming a planarization layer at a side of the passivation protection material away from the substrate;

forming the structure material layer in the peripheral region and the cutting region comprises:

forming an organic light-emitting material in the peripheral region and the cutting region;

forming an electrode structure at a side of the organic light-emitting material away from the substrate in the peripheral region and the cutting region;

forming a first organic structure at a side of the electrode structure away from the substrate in the peripheral region and the cutting region;

forming the light-emitting unit in the display region comprises:

forming a first electrode layer at a side of the planarization layer away from the substrate in the display region;

forming a pixel defining layer at a side of the first electrode layer away from the substrate in the display region wherein a plurality of pixel openings are disposed in the pixel defining layer;

forming an organic light-emitting material layer in the display region;

forming a second electrode layer at a side of the organic light-emitting material layer away from the substrate in the display region, wherein forming the first organic structure at the side of the electrode structure away from the substrate in the peripheral region and the cutting region is performed after the second electrode layer is formed at the side of the organic light-emitting material layer away from the substrate in the display region, and wherein forming the organic light-emitting structure in the isolation region, forming the organic light-emitting material in the peripheral region and the cutting region and forming the organic light-emitting material layer in the display region are performed synchronously.

14. The method for manufacturing a display substrate of claim 12, further comprises forming a barrier wall structure in the hole region which comprises:

forming a first barrier wall structure close to the cutting region, and forming a second barrier wall structure away from the cutting region, wherein a distance from a surface of the second barrier wall structure away from the substrate to the substrate is smaller than a distance from a surface of the first barrier wall structure away from the substrate to the substrate;

wherein forming the first barrier wall structure close to the cutting region and forming the second barrier wall structure away from the cutting region comprise:

forming a first partition portion in the hole region;

forming a second partition portion at a side of the first partition portion away from the substrate and forming the second barrier wall structure at a side of the first partition portion away from the cutting region;

wherein forming the first partition portion in the hole region and forming the planarization layer at the side of the passivation protection material away from the substrate are performed synchronously;

wherein forming the second partition portion at the side of the first partition portion away from the substrate, forming the second barrier wall structure at the side of the first partition portion away from the cutting region and forming the pixel defining layer at the side of the first electrode layer away from the substrate in the display region are performed synchronously.

15. The method for manufacturing a display substrate of claim 12, wherein forming the isolation column comprises:

forming at least two isolation columns disposed around the peripheral region;

forming the passivation protection material at the side of the thin film transistor away from the substrate comprises:

at the side of the thin film transistor away from the substrate, forming a passivation layer in the display region and a passivation protection layer in the isolation region at the same time, wherein the passivation protection layer wraps at least part of a top wall and a side wall of the isolation column close to the peripheral region and covers a region between the isolation column close to the peripheral region and the peripheral region.

16. The method for manufacturing a display substrate of claim 15, further comprising:

in the isolation region, forming a second organic structure overlapping with the passivation protection layer, wherein forming the second organic structure and forming the first organic structure are performed synchronously.

17. The method for manufacturing a display substrate of claim 16, wherein forming the encapsulation layer in the display region, the isolation region, the peripheral region, the cutting region and the hole region comprises:

forming a first inorganic material layer in the display region, the isolation region, the peripheral region, the cutting region and the hole region;

forming the organic material layer at a side of the first inorganic material layer away from the substrate in the display region; and forming a second inorganic material layer at a side of the organic material layer away from the substrate in the display region, the isolation region, the peripheral region, the cutting region and the hole region.

18. The method for manufacturing a display substrate of claim 11, wherein forming the isolation column in the isolation region comprises:

forming a first film layer surrounding the hole region at a side of the substrate;

forming a second film layer surrounding the hole region at a side of the first film layer away from the substrate;

forming a first metal layer at a side of the second film layer away from the substrate, forming a second metal layer on the first metal layer, and forming a third metal layer on the second metal layer;

wherein an orthographic projection of the second metal layer on the substrate is located within an orthographic projection of the first metal layer on the substrate and within an orthographic projection of the third metal layer on the substrate; the orthographic projection of the first metal layer on the substrate and the orthographic projection of the third metal layer on the substrate are located within an orthographic projection of the first film layer on the substrate and within an orthographic projection of the second film layer on the substrate respectively;

forming the thin film transistor and the capacitor comprises:

forming a gate electrode of the thin film transistor and a first pole plate of the capacitor at a side of the substrate;

forming a second pole plate of the capacitor at a side of the first pole plate away from the substrate;

forming a source electrode and a drain electrode of the thin film transistor at a side of the gate electrode away from the substrate;

forming the source electrode and the drain electrode of the thin film transistor at the side of the gate electrode away from the substrate comprises:

forming a fourth metal layer at a side of the gate electrode away from the substrate, a fifth metal layer on the fourth metal layer and a sixth metal layer on the fifth metal layer;

wherein forming the first film layer surrounding the hole region at a side of the substrate and forming the gate electrode of the thin film transistor and the first pole plate of the capacitor at a side of the substrate are performed synchronously;

forming the second film layer surrounding the hole region at the side of the first film layer away from the substrate and forming the second pole plate of the capacitor at the side of the first pole plate away from the substrate are performed synchronously;

forming the first metal layer at the side of the second film layer away from the substrate, the second metal layer on the first metal layer and the third metal layer on the second metal layer, and forming the fourth metal layer at the side of the gate electrode away from the substrate, the fifth metal layer on the fourth metal layer and the sixth metal layer on the fifth metal layer are performed synchronously.

19. A display substrate, comprising:

a substrate; and, a display region, an isolation region, a peripheral region and a hole disposed on the substrate, wherein the display region surrounds the hole, the isolation region is disposed between the display region and the peripheral region, and the peripheral region surrounds and adjoins the hole;

the isolation region is provided with at least one isolation column and a first inorganic structure, the isolation column is disposed at a side of the substrate, and the first inorganic structure is disposed at a side of the isolation column away from the substrate;

the peripheral region is provided with a structure layer, and the structure layer is disposed on the substrate and comprises a first organic structure and a second inorganic structure disposed along a direction perpendicular to the substrate;

each of the first inorganic structure, the second inorganic structure and the first organic structure is made of an insulation material, and the first inorganic structure and the second inorganic structure are configured to encapsulate the display substrate, wherein a difference between a distance from a surface of the peripheral region away from the substrate to the substrate and a maximal distance from a surface of a part of the first inorganic structure to the substrate is in a range of [−1 μm, 1 μm], wherein the part is located at a side away from the substrate of the isolation column close to the peripheral region.

20. The method for manufacturing a display substrate of claim 11, wherein a difference between a distance from a surface of the structure material layer away from the substrate to the substrate and a distance from a surface of the isolation column away from the substrate to the substrate is in a range of [−1 μm, 1 μm].

*    *    *    *    *